(12) United States Patent
Kim et al.

(10) Patent No.: US 9,472,785 B2
(45) Date of Patent: Oct. 18, 2016

(54) ORGANIC LIGHT-EMITTING DIODE

(71) Applicant: Samsung Display Co., Ltd., Yongin, Gyeonggi-do (KR)

(72) Inventors: Hee-Yeon Kim, Yongin (KR); Jung-Sub Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 640 days.

(21) Appl. No.: 13/927,002

(22) Filed: Jun. 25, 2013

(65) Prior Publication Data

US 2014/0231759 A1    Aug. 21, 2014

(30) Foreign Application Priority Data

Feb. 21, 2013    (KR) .................. 10-2013-0018838

(51) Int. Cl.
*H01L 51/52*    (2006.01)
*H01L 51/00*    (2006.01)

(52) U.S. Cl.
CPC ....... *H01L 51/5262* (2013.01); *H01L 51/0072* (2013.01); *H01L 51/5234* (2013.01); *H01L 51/0059* (2013.01)

(58) Field of Classification Search
CPC ........... H01L 51/0059; H01L 51/0072; H01L 51/5234; H01L 51/5262; C09K 11/06
See application file for complete search history.

(56) References Cited

U.S. PATENT DOCUMENTS

| 2002/0158242 | A1 |  | 10/2002 | Son et al. |
| 2004/0113547 | A1 |  | 6/2004 | Son et al. |
| 2006/0113905 | A1 | * | 6/2006 | Nakamura .......... H01L 27/3244 313/511 |

(Continued)

FOREIGN PATENT DOCUMENTS

| JP | 2007-189001 | * | 7/2007 |
| KR | 10-2004-0051507 |  | 6/2004 |

(Continued)

OTHER PUBLICATIONS

Machine translation for JP 2007-189001 A (publication date Jul. 2007).*

(Continued)

*Primary Examiner* — Dawn Garrett
(74) *Attorney, Agent, or Firm* — Lewis Roca Rothgerber Christie LLP

(57) ABSTRACT

An organic light-emitting device includes a first electrode; a second electrode; an organic layer between the first electrode and the second electrode; and a light efficiency-improvement layer disposed on the first electrode or the second electrode. The light efficiency-improvement layer includes a heterocyclic compound represented by Formula 1,

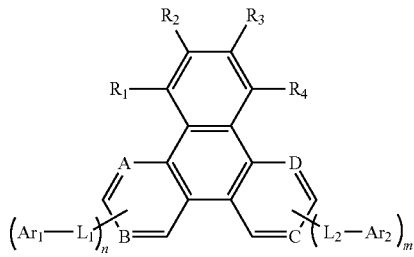

which is described in more detail in the detailed description section of the present application.

20 Claims, 2 Drawing Sheets

(56) References Cited

U.S. PATENT DOCUMENTS

| | | |
|---|---|---|
| 2006/0131562 A1 | 6/2006 | Li |
| 2009/0033212 A1* | 2/2009 | Ahn ............... H01L 51/5036 313/504 |
| 2010/0039026 A1 | 2/2010 | Yang et al. |
| 2011/0108819 A1* | 5/2011 | Kathirgamanathan ............... C07D 263/57 257/40 |
| 2011/0240979 A1* | 10/2011 | Kim ............... C07D 487/04 257/40 |
| 2011/0278555 A1 | 11/2011 | Inoue et al. |
| 2011/0279020 A1 | 11/2011 | Inoue et al. |
| 2013/0009543 A1* | 1/2013 | Kadoma ........... C07D 401/10 313/504 |
| 2014/0151650 A1* | 6/2014 | Lee ............... H01L 51/0071 257/40 |

FOREIGN PATENT DOCUMENTS

| | | |
|---|---|---|
| KR | 10-2010-0021908 | 2/2010 |
| KR | 10-2011-0092262 | 8/2011 |
| KR | 10-2012-0034648 | 4/2012 |
| KR | 10-2012-0044517 | 5/2012 |
| KR | 10-2012-0044529 | 5/2012 |

OTHER PUBLICATIONS

U.S. Office action dated Oct. 22, 2015, for cross reference U.S. Appl. No. 14/012,545, (21 pages).

* cited by examiner

ORGANIC LIGHT-EMITTING DIODE

CROSS-REFERENCE TO RELATED PATENT APPLICATION

This application claims priority to and the benefit of Korean Patent Application No. 10-2013-0018838, filed on Feb. 21, 2013, in the Korean Intellectual Property Office, the disclosure of which is incorporated herein in its entirety by reference.

BACKGROUND

1. Field

The following description relates to an organic light-emitting diode.

2. Description of the Related Art

Organic light emitting diodes (OLEDs) are self-emission devices, which have advantages such as a wide viewing angle, a high contrast ratio, a short response time, and excellent brightness, driving voltage, and response speed characteristics, and capable of generation of multi-color images.

In a typical organic light-emitting diode, an anode is formed on a substrate, and a hole transport layer, an emission layer, an electron transport layer, and a cathode are sequentially formed in this stated order on the anode. In this regard, the hole transport layer, the emission layer, and the electron transport layer are organic films including organic compounds.

The operating principle of an organic light-emitting diode having such a structure is described below.

When a voltage is applied between the anode and the cathode, holes injected from the anode pass through the hole transport layer and migrate toward the emission layer, and electrons injected from the cathode pass through the electron transport layer and migrate toward the emission layer. The holes and the electrons are recombined with each other in the emission layer to generate excitons. Then, the excitons are transitioned from an excited state to a ground state, thereby generating light.

SUMMARY

Aspects of the present invention are directed toward an organic light-emitting diode with improved light efficiency.

According to an embodiment of the present invention, an organic light-emitting device includes:

a first electrode;

a second electrode;

an organic layer interposed between the first electrode and the second electrode; and a light efficiency-improvement layer disposed on the first electrode or the second electrode, wherein the light efficiency-improvement layer includes a heterocyclic compound represented by Formula 1 below:

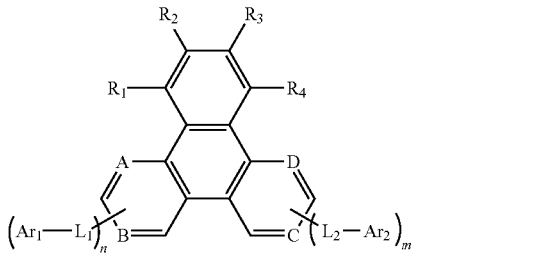

<Formula 1> wherein $R_1$ to $R_4$ are, each independently, a hydrogen atom, a deuterium, a substituted or unsubstituted C5 to C60 alkyl group, a substituted or unsubstituted C6 to C60 aryl group, or a substituted or unsubstituted C6 to C60 condensed polycyclic group;

$L_1$ and $L_2$ are, each independently, a single bond, a substituted or unsubstituted C6 to C60 aryl group, a substituted or unsubstituted C3 to C60 heteroaryl group, or a substituted or unsubstituted C6 to C60 condensed polycyclic group;

$Ar_1$ and $Ar_2$ are, each independently, a substituted or unsubstituted C6 to C60 aryl group, a substituted or unsubstituted C3 to C60 heteroaryl group, or a substituted or unsubstituted C6 to C60 condensed polycyclic group;

A, B, C, and D represent, each independently, —CH= or —N=, provided that A, B, C, and D are not all —CH= at the same time; and m and n are, each independently, an integer of 0 to 3, provided that m and n are not both 0 at the same time.

According to another embodiment of the present invention, a flat panel display apparatus includes the organic light-emitting device, and the first electrode of the organic light-emitting device is electrically connected to a source electrode or drain electrode constituting a thin film transistor.

BRIEF DESCRIPTION OF THE DRAWINGS

The above and other features and advantages of the present invention will become more apparent by describing in detail example embodiments thereof with reference to the attached drawings in which.

DETAILED DESCRIPTION

Figure 1:
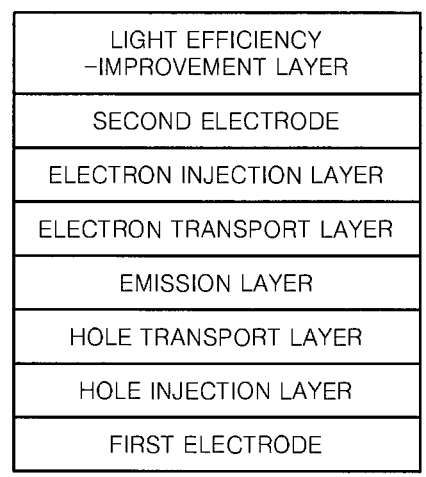
FIG. 1 is a schematic view of an organic light-emitting device according to an embodiment of the present invention.

As used herein, the term "and/or" includes any and all combinations of one or more of the associated listed items. Expressions such as "at least one of," when preceding a list of elements, modify the entire list of elements and do not modify the individual elements of the list.

An organic light-emitting device according to an embodiment of the present invention includes a first electrode, a second electrode; an organic layer disposed between the first electrode and the second electrode, and a light efficiency-improvement layer disposed on the first electrode or the second electrode, wherein the light efficiency-improvement layer includes the heterocyclic compound represented by Formula 1 below:

<Formula 1>

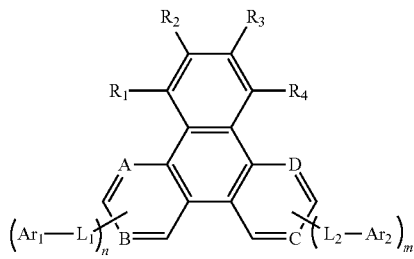

wherein $R_1$ to $R_4$ are, each independently, a hydrogen atom, a deuterium, a substituted or unsubstituted C5 to C60 alkyl group, a substituted or unsubstituted C6 to C60 aryl group, or a substituted or unsubstituted C6 to C60 condensed polycyclic group;

$L_1$ and $L_2$ are, each independently, a single bond, a substituted or unsubstituted C6 to C60 aryl group, a substituted or unsubstituted C3 to C60 heteroaryl group, or a substituted or unsubstituted C6 to C60 condensed polycyclic group;

$Ar_1$ and $Ar_2$ are, each independently, a substituted or unsubstituted C6 to C60 aryl group, a substituted or unsubstituted C3 to C60 heteroaryl group, or a substituted or unsubstituted C6 to C60 condensed polycyclic group;

A, B, C, and D represent each independently —CH═ or —N═, provided that A, B, C, and D are not all —CH═ at the same time; and m and n are, each independently, an integer of 0 to 3, provided that m and n are not both 0 at the same time.

Light efficiency of an organic light-emitting device conventionally is divided into an internal luminescent efficiency and an external luminescent efficiency. The internal luminescent efficiency is associated with how efficiently excitons are generated and light conversion occurs in an organic layer, such as a hole transport layer, an emission layer, or an electron transport layer, between a first electrode and a second electrode (that is between an anode and a cathode). Also, the external luminescent efficiency (hereinafter referred to as "light coupling efficiency") refers to how efficiently light generated in the organic layer is emitted toward outside the organic light-emitting device. For example, even when the organic layer has high light conversion efficiency (that is, high internal luminescent efficiency), a low external luminescent efficiency leads to a decrease in the total light efficiency of the organic light-emitting device.

An external luminescent efficiency of an organic light-emitting device including a light efficiency layer containing the compound of Formula 1 according to an embodiment of the present invention is higher than an external luminescent efficiency of a comparable organic light-emitting device without a light efficiency layer containing the compound of Formula 1. Accordingly, the total light efficiency of the organic light-emitting device according to an embodiment of the present invention is higher than a comparable organic light-emitting device.

Hereinafter, a substituent associated with the compound of Formula 1 is described in more detail.

According to an embodiment of the present invention, $R_1$ to $R_4$ in Formula 1 are, each independently, a hydrogen atom or a deuterium.

According to an embodiment of the present invention, $L_1$ and $L_2$ in Formula 1 may be, each independently, a single bond, or one of Formulae 2a to 2c below:

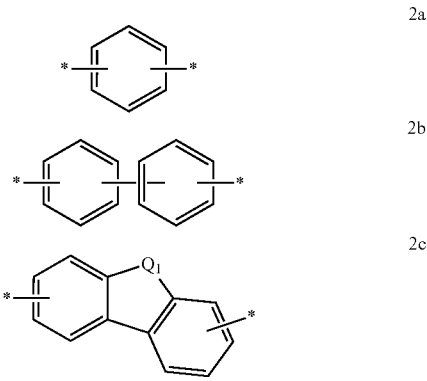

wherein, $Q_1$ represents —$CR_{30}R_{31}$—;

$R_{30}$ and $R_{31}$ are, each independently, a hydrogen atom, a deuterium, a substituted or unsubstituted C1 to C20 alkyl group, a substituted or unsubstituted C5 to C20 aryl group, a substituted or unsubstituted C3 to C20 heteroaryl group, a substituted or unsubstituted C6 to C20 condensed polycyclic group, a halogen group, a cyano group, a nitro group, a hydroxy group, or a carboxy group, and * indicates a bond.

According to another embodiment of the present invention, $Ar_1$ and $Ar_2$ in Formula 1 may be, each independently, one of Formulae 3a to 3j:

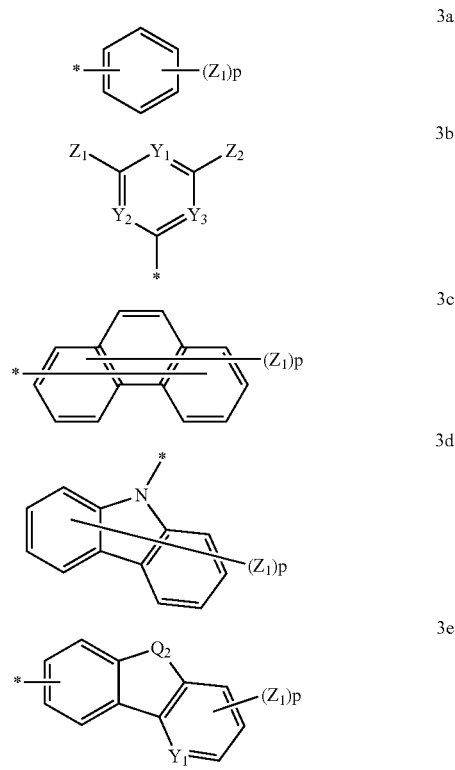

-continued

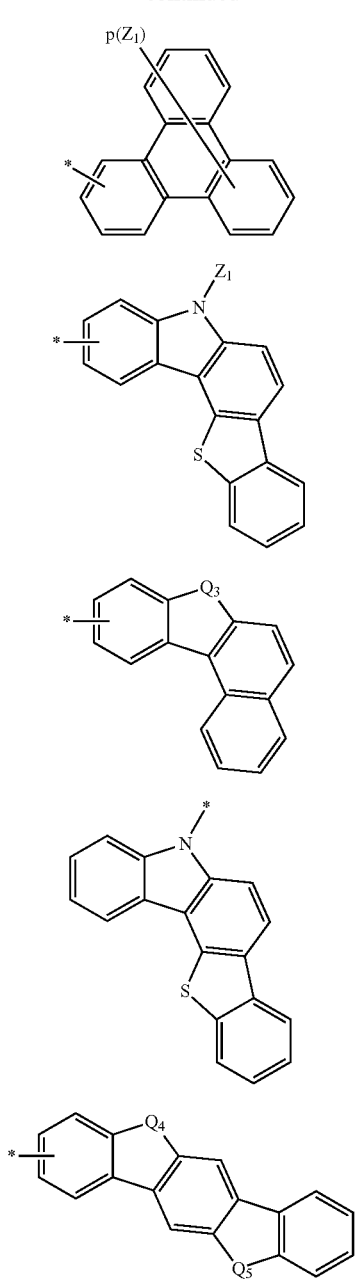

wherein, $Q_2$ to $Q_5$ are, each independently, $-CR_{30}R_{31}-$, $-NR_{32}-$, $-S-$, or $-O-$;

$Z_1$, $Z_2$, $R_{30}$, $R_{31}$ and $R_{32}$ are, each independently, a hydrogen atom, a deuterium, a substituted or unsubstituted C1 to C20 alkyl group, a substituted or unsubstituted C5 to C20 aryl group, a substituted or unsubstituted C3 to C20 heteroaryl group, a substituted or unsubstituted C6 to C20 condensed polycyclic group, an amino group substituted with a C5 to C20 aryl group or a C3 to C20 heteroaryl group, a halogen group, a cyano group, a nitro group, a hydroxy group, $-Si(R_{40})_3$, or a carboxy group;

$R_{40}$ is a substituted or unsubstituted C1 to C20 alkyl group, a substituted or unsubstituted C5 to C20 aryl group, a substituted or unsubstituted C3 to C20 heteroaryl group, or a substituted or unsubstituted C6 to C20 condensed polycyclic group;

$Y_1$, $Y_2$, and $Y_3$ are, each independently, $-CH=$ or $-N=$; and p is an integer of 1 to 9; and * indicates a bond.

According to another embodiment of the present invention, in Formula 1, A and D may be both $-N=$, and B and C may be both $-CH=$.

Hereinafter, the definition of substituents used herein is described in more detail (the number of carbon atoms limiting a substituent is non-limited and does not restrict properties of the substituent).

An unsubstituted C1 to C60 alkyl group used herein may be linear or branched, and non-limiting examples thereof are methyl, ethyl, propyl, isobutyl, sec-butyl, pentyl, iso-amyl, hexyl, heptyl, octyl, nonanyl, or dodecyl, and at least one hydrogen atom of the alkyl group may be substituted with a deuterium element, a halogen atom, a hydroxyl group, a nitro group, a cyano group, an amino group, an amidino group, hydrazine, hydrazone, a carboxyl group or a salt thereof, a sulfonic acid or a salt thereof, a phosphoric acid or a salt thereof, a C1 to C10 alkyl group, a C1 to C10 alkoxy group, a C2 to C10 alkenyl group, a C2 to C10 alkynyl group, a C6 to C16 aryl group, or a C4 to 16 heteroaryl group.

An unsubstituted C2 to C60 alkenyl group used herein refers to an unsubstituted alkyl group having one or more carbon double bonds at a center or end thereof. Examples of the unsubstituted C2 to C60 alkenyl group are ethenyl, prophenyl, and butenyl. At least one hydrogen atom of the unsubstituted alkenyl group may be substituted with the same substituent as described above in connection with the substituted alkyl group.

An unsubstituted C2 to C60 alkynyl group used herein refers to the alkyl group having one or more carbon triple bonds at a center or end thereof. Examples thereof are acetylene, propylene, phenylacetylene, naphthylacetylene, isopropylacetylene, t-butylacetylene, and diphenylacetylene. At least one hydrogen atom of the alkynyl group may be substituted with the same substituent as described above in connection with the substituted alkyl group.

An unsubstituted C3 to C60 cycloalkyl group used herein refers to a C3 to C60 cyclic alkyl group, and at least one hydrogen atom of the cycloalkyl group may be substituted with the same substituent as described above in connection with the C1 to C60 alkyl group.

An unsubstituted C1 to C60 alkoxy group used herein refers to a group having a structure of $-OA$ (wherein A is the unsubstituted C1 to C60 alkyl group, and non-limiting examples thereof are methoxy, ethoxy, propoxy, isopropyloxy, butoxy, and pentoxy). At least one hydrogen atom of the alkoxy group may be substituted with the same substituent as described above in connection with the alkyl group.

An unsubstituted C6 to C60 aryl group used herein refers to a carbocyclic aromatic system having one or more rings, and when the number of rings is two or more, the rings may be fused or may be connected via a single bond. The term 'aryl' includes an aromatic system, such as phenyl, naphthyl, or anthracenyl. Also, at least one hydrogen atom of the aryl group may be substituted with the same substituent as described above in connection with the C1 to C60 alkyl group.

Examples of the substituted or unsubstituted C6 to C60 aryl group are a phenyl group, a C1 to C10 alkylphenyl group (for example, ethylphenyl group), a halophenyl group (for example, a o-, m- and p-fluorophenyl group, or a dichlorophenyl group), a cyanophenyl group, a dicyanophenyl group, a trifluoromethoxyphenyl group, a biphenyl group, a halobiphenyl group, a cyanobiphenyl group, a C1 to C10 alkylbiphenyl group, a C1 to C10 alkoxybiphenyl group, an o-, m-, and p-tolyl group, an o-, m- and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, halonaphthyl group (for example, a fluoronaphthyl group), a C1 to C10 alkylnaphthyl group (for example, methylnaphthyl group), a C1 to C10 alkoxynaphthyl group (for example, a methoxynaphthyl group), a cyanonaphthyl group, an anthracenyl group, azrenyl group, a heptalenyl group, an acenaphthylenyl group, a phenalenyl group, a fluorenyl group, an anthraquinolinyl group, a methylanthryl group, a phenanthryl group, a triphenylenyl group, a pyrenyl group, a chrysenyl group, an ethyl-chrysenyl group, a picenyl group, perylenyl group, a chloroperylenyl group, a pentaphenyl group, a pentasenyl group, a tetraphenylenyl group, a hexaphenyl group, a hexacenyl group, a rubicenyl group, a coroneryl group, a trinaphthylenyl group, a heptaphenyl group, a heptacenyl group, a piranthrenyl group, and an obarenyl group.

A C3 to C60 unsubstituted heteroaryl group used herein contains one or two or three hetero atoms selected from N, O, P, and S, and when the heteraryl group contains 2 or more rings, these rings may be fused to each other or may be connected to each other via a single bond. Examples of the unsubstituted C4 to C60 heteroaryl group are a pyrazolyl group, an imidazolyl group, a oxazolyl group, a thiazolyl group, a triazolyl group, tetrazolyl, an oxadiazolyl group, a pyridinyl group, a pyridazinyl group, a pyrimidinyl group, a triazinyl group, a carbazolyl group, an indolyl group, a quinolinyl group, an isoquinolinyl group, and dibenzothiophene. Also, at least one hydrogen atom of the heteroaryl group may be substituted with the same substituent as described above in connection with the C1 to C60 alkyl group.

The unsubstituted C6 to C60 aryloxy group refers to a group represented by —OA$_1$, wherein A$_1$ is the C6 to C60 aryl group. Examples of the aryloxy group are a phenoxy group and the like. At least one hydrogen atom of the aryloxy group may be substituted with the same substituent as described above in connection with the C1 to C60 alkyl group.

The unsubstituted C6 to C60 arylthio group used herein refers to a group represented by —SA$_1$, wherein A$_1$ is a C6 to C60 aryl group. Examples of the arylthio group are a benzenethio group and a naphthylthio group. At least one hydrogen atom of the arylthio group may be substituted with the same substituent as described above in connection with the C1 to C60 alkyl group.

An unsubstituted C6 to C60 condensed polycyclic group used herein refers to a substituent containing two or more rings each having at least one aromatic ring fused with at least one non-aromatic ring or a substituent that has a unsaturated group in a ring but does not have a coordination structure. The condensed polycyclic group is distinguished from an aryl group or a heteroaryl group in that the condensed polycyclic group does not overall have aromatic properties.

Examples of the compound represented by Formula 1 are shown below, but are not limited thereto.

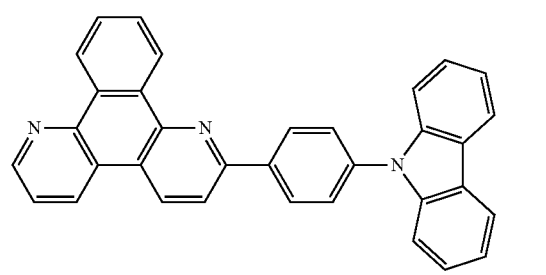

1

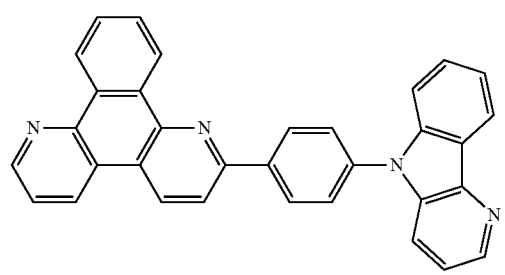

2

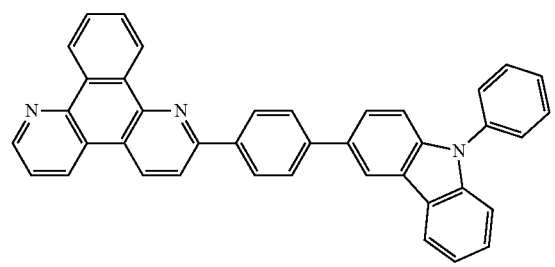

3

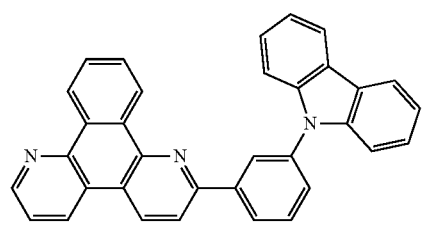

4

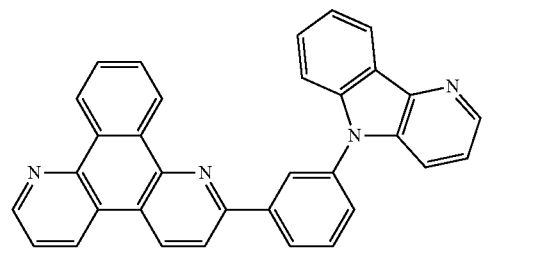

5

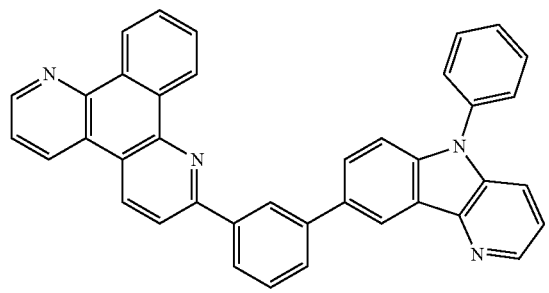

6

-continued
7
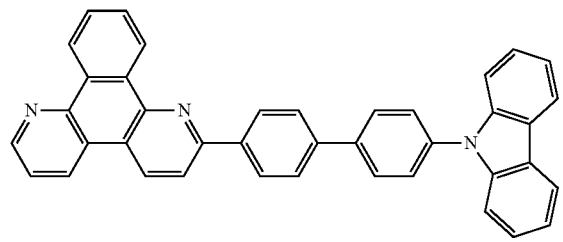
8
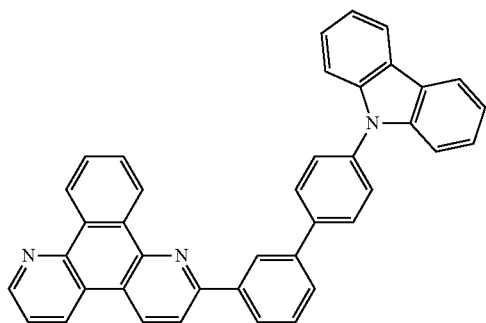
9
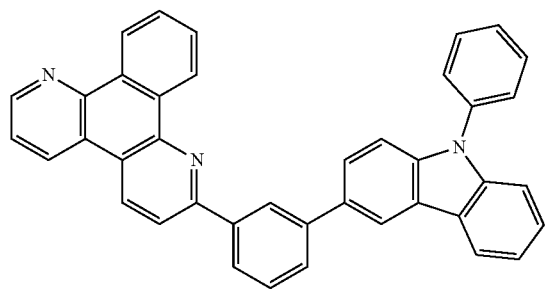
10
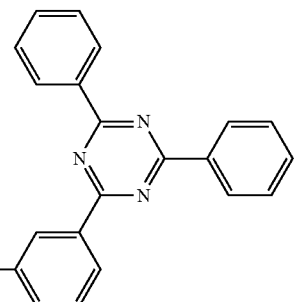
11
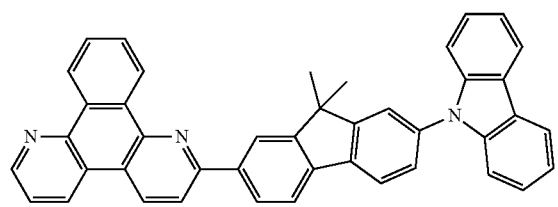
12
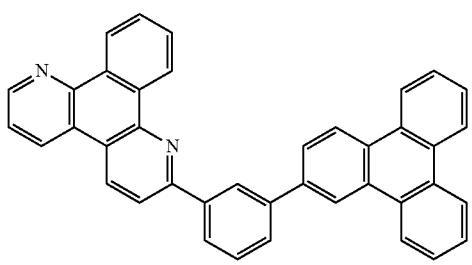
13
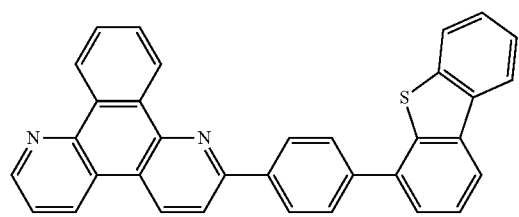
14
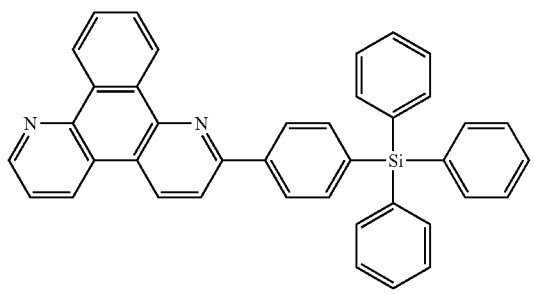
15
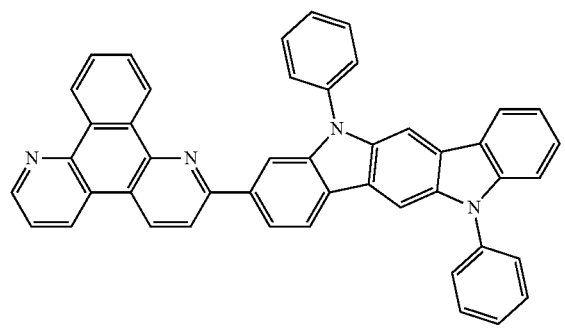
16
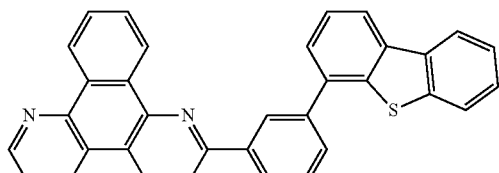

-continued
17
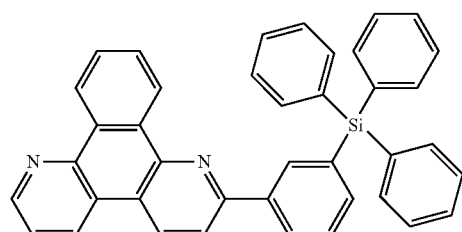
18
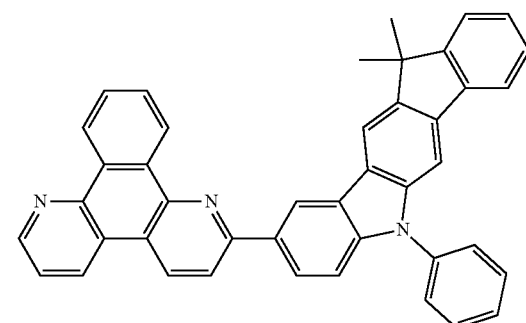
19
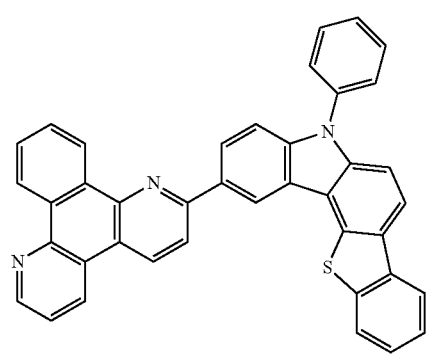
20
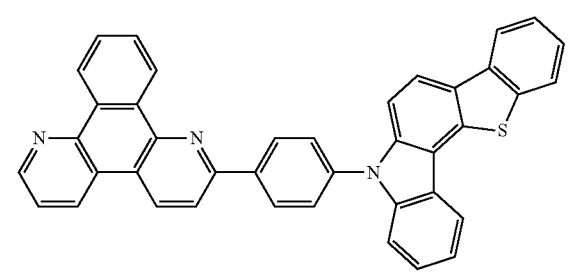
21
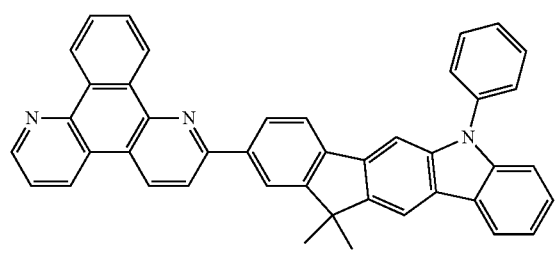
22
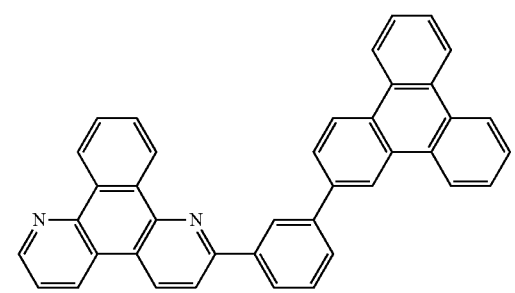
23
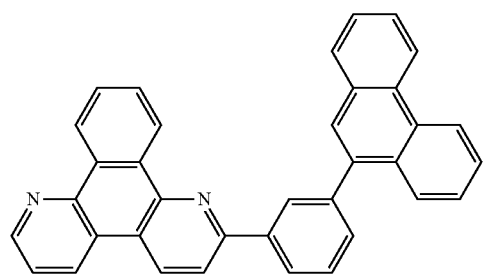
24
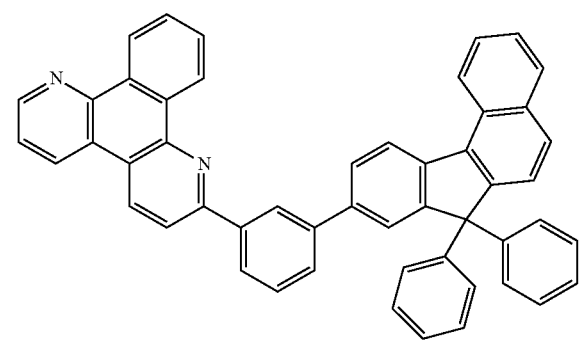
25
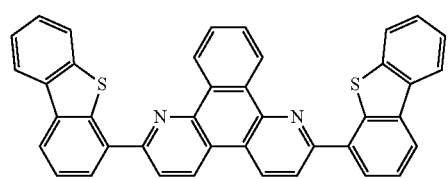
26
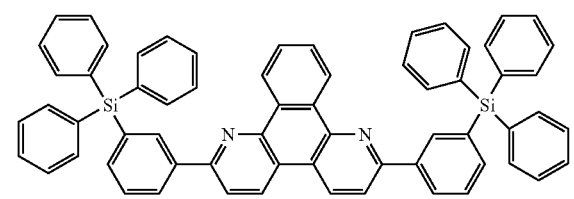

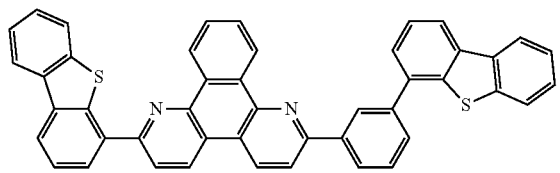

27

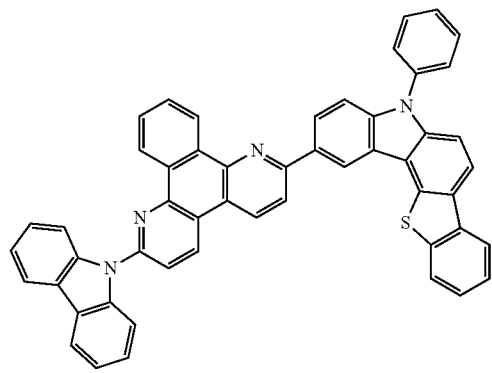

28

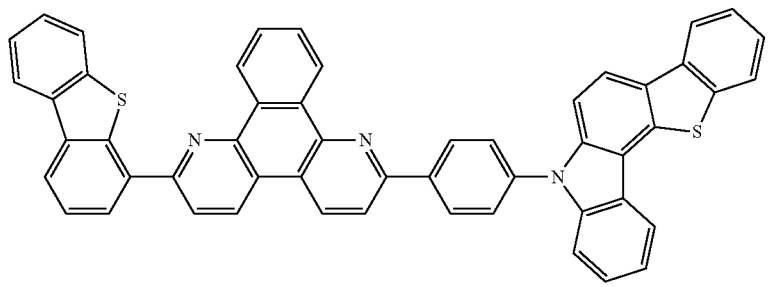

29

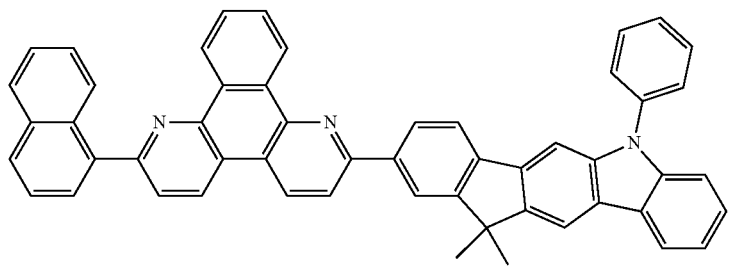

30

An organic light-emitting device according to an embodiment of the present invention includes a first electrode, a second electrode, and an organic layer between the first electrode and the second electrode.

The organic layer may include at least one layer selected from a hole injection layer, a hole transport layer, a functional layer having both a hole injection function and a hole transport function (hereinafter referred to as "H-functional layer"), a buffer layer, an electron blocking layer, an emission layer, a hole blocking layer, an electron transport layer, an electron injection layer, and a functional layer having both an electron transport function and an electron injection function (hereinafter referred to as "E-functional layer").

According to an embodiment of the present invention, the organic light-emitting device may include an electron injection layer, an electron transport layer, an emission layer, a hole injection layer, a hole transport layer, or a functional layer having both a hole injection capability and a hole transportation capability, and the emission layer may further include an anthracene-based compound, an arylamine-based compound, or a styryl-based compound.

According to another embodiment of the present invention, the organic light-emitting device may include an electron injection layer, an electron transport layer, an emission layer, a hole injection layer, a hole transport layer, or a functional layer having both a hole injection capability and a hole transportation capability, and the emission layer may include a red layer, a green layer, a blue layer, and a white layer, and any one of these layers may include a phosphorescent compound, and the hole injection layer, the hole transport layer, or the functional layer having both a hole injection capability and a hole transportation capability may include a charge-generating material. Also, the charge-generating material may be a p-dopant, and the p-dopant may be a quinone derivative, a metal oxide, or a cyano group-containing compound.

According to another embodiment of the present invention, the organic layer may include an electron transport layer that includes an electron-transportable organic compound and a metal complex. The metal complex may be a Li complex.

The term "organic layer" used herein refers to a single layer and/or a plurality of layers between the first electrode and the second electrode of an organic light-emitting diode.

FIG. 1 is a schematic cross-sectional view of an organic light-emitting device according to an embodiment of the present invention. Hereinafter, with reference to FIG. 1, the structure of an organic light-emitting diode according to an embodiment of the present invention, and a method of manufacturing the organic light-emitting diode, according to an embodiment of the present invention, will be described in more detail.

The substrate may be any one of various substrates that are suitable for an organic light-emitting device, and may be a glass substrate or a transparent plastic substrate with excellent mechanical strength, thermal stability, transparency, surface smoothness, ease of handling, and/or water repellency.

The first electrode may be formed by depositing or sputtering a material for a first electrode on the substrate. When the first electrode is an anode, the material for forming the first electrode may be selected from materials with a high work function to enable ease of hole injection. The first electrode may be a reflective electrode or a transmission electrode. The material for the first electrode may be a transparent material with high conductivity, and examples of such a material are indium tin oxide (ITO), indium zinc oxide (IZO), tin oxide ($SnO_2$), and zinc oxide (ZnO). According to an embodiment of the present invention, to form the first electrode as a reflective electrode, magnesium (Mg), aluminum (Al), aluminum-lithium (Al—Li), calcium (Ca), magnesium-indium (Mg—In), or magnesium-silver (Mg—Ag) may be used.

The first electrode may have a single-layer structure or a multi-layer structure including at least two layers. For example, the first electrode may have a three-layered structure of ITO/Ag/ITO, but is not limited thereto.

An organic layer may be formed on the first electrode.

The organic layer may include a hole injection layer, a hole transport layer, a buffer layer, an emission layer, an electron transport layer, and an electron injection layer.

A hole injection layer (HIL) may be formed on the first electrode by using any one of various suitable methods, for example, vacuum deposition, spin coating, casting, or Langmuir-Blodgett (LB) deposition.

When an HIL is formed by vacuum deposition, the deposition conditions may vary according to the material that is used to form the HIL, and the structure and thermal characteristics of the HIL. For example, the deposition conditions may include a deposition temperature of about 100 to about 500° C., a vacuum pressure of about $10^{-8}$ to about $10^{-3}$ torr, and a deposition rate of about 0.01 to about 100 Å/sec. However, the deposition conditions are not limited thereto.

When the HIL is formed using spin coating, coating conditions may vary according to the material used to form the HIL, and the structure and thermal properties of the HIL. For example, a coating speed may be from about 2000 rpm to about 5000 rpm, and a temperature at which a heat treatment is performed to remove a solvent after coating may be from about 80° C. to about 200° C. However, the coating conditions are not limited thereto.

For use as a hole injection material, any suitable hole injection material may be used. Examples of suitable hole injection material are N,N'-diphenyl-N,N'-bis-[4-(phenyl-m-tolyl-amino)-phenyl]-biphenyl-4,4'-diamine (DNTPD), a phthalocyanine compound such as a copper phthalocyanine, 4,4',4''-tris(3-methylphenylphenylamino)triphenylamine [m-MTDATA], N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and (polyaniline)/poly(4-styrenesulfonate) (PANI/PSS), but the hole injection material is not limited thereto.

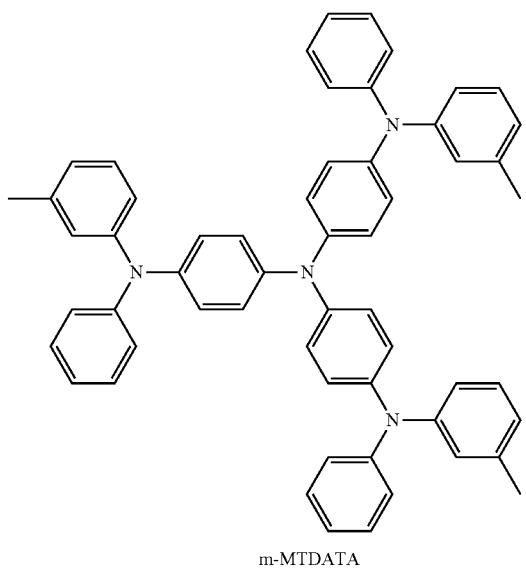

m-MTDATA

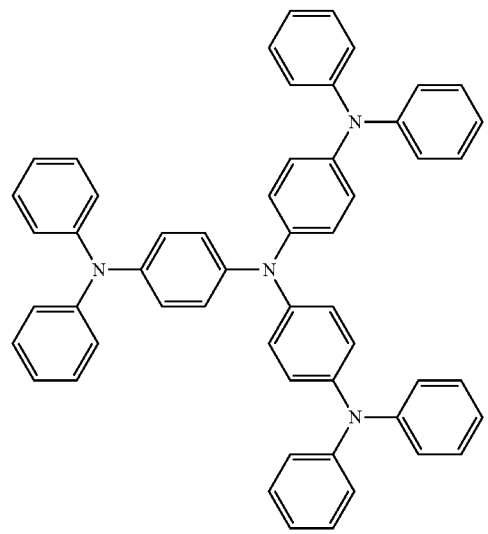

TDATA

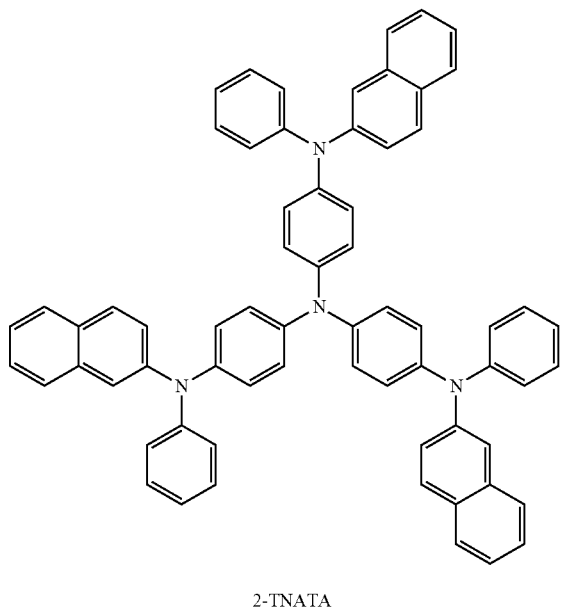

2-TNATA

A thickness of the HIL may be in a range of about 100 Å to about 10000 Å, for example, about 100 Å to about 1000 Å. In one embodiment, when the thickness of the HIL is within the range described above, the HIL has satisfactory hole injection characteristics without a substantial increase in the driving voltage.

Then, a hole transportation layer (HTL) may be formed on the HIL by using vacuum deposition, spin coating, casting, Langmuir-Blodgett (LB) deposition, or the like. When the HTL is formed by vacuum deposition or spin coating, the deposition or coating conditions may be similar to those applied to form the HIL, although the deposition or coating conditions may vary according to the material that is used to form the HTL.

For use as a hole transportation material, any suitable hole transportation material may be used. Examples of a suitable hole transportation material are a carbazole derivative, such as N-phenylcarbazole, or polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), and N,N'-di(1-naphthyl)-N,N'-diphenylbenzidine (NPB), but are not limited thereto.

TPD

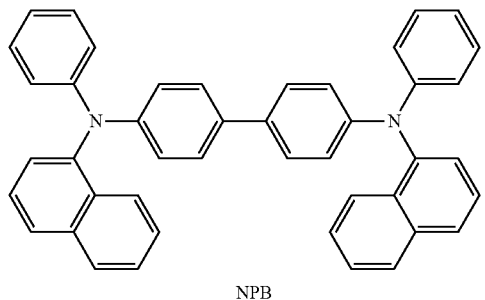

NPB

A thickness of the HTL may be in a range of about 50 Å to about 2000 Å, for example, about 100 Å to about 1500 Å. In one embodiment, when the thickness of the HTL is within the range described above, the HTL has satisfactory hole transportation characteristics without a substantial increase in the driving voltage.

The H-functional layer (having both a hole injection capability and a hole transport capability) may include at least one material selected from the hole injection materials and the hole transportation materials, and a thickness of the H-functional layer may be in a range of about 500 Å to about 10000 Å, for example, about 100 Å to about 1000 Å. In one embodiment, when the thickness of the H-functional layer is within the range described above, satisfactory hole injection and transportation properties are obtained without a substantial increase in the driving voltage.

Also, at least one layer selected from the hole injection layer, the hole transport layer, and the H-functional layer may include at least one selected from a compound represented by Formula 300 below and a compound represented by Formula 350 below:

<Formula 300>

-continued

<Formula 350>

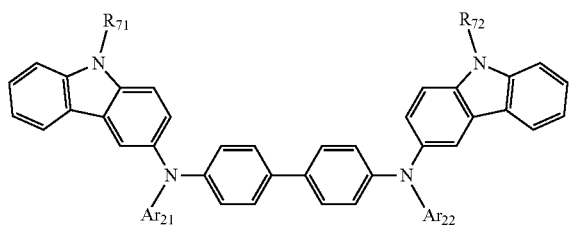

Ar$_{11}$, Ar$_{12}$, Ar$_{21}$ and Ar$_{22}$ in Formulae 300 and 350 are, each independently, a substituted or unsubstituted C$_5$-C$_{60}$ arylene group;

e and f in Formula 300 may be, each independently, an integer of 0 to 5, or 0, 1 or 2. For example, e may be 1 and f may be 0, and e and f are not limited thereto.

R$_{51}$ to R$_{58}$, R$_{61}$ to R$_{59}$ and R$_{71}$ and R$_{72}$ in Formulae 300 and 350 are, each independently, a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{60}$ cycloalkyl group, a substituted or unsubstituted C$_5$-C$_{60}$ aryl group, a substituted or unsubstituted C$_5$-C$_{60}$ aryloxy group, or a substituted or unsubstituted C$_5$-C$_{60}$ arylthio group. For example, R$_{51}$ to R$_{58}$, R$_{61}$ to R$_{69}$ and R$_{71}$ and R$_{72}$ are, each independently, a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a C$_1$-C$_{10}$ alkyl group (for example, a methyl group, an ethyl group, a propyl group, a butyl group, a pentyl group, a hexyl group, or the like), a C$_1$-C$_{10}$ alkoxy group (for example, a methoxy group, an ethoxy group, a propoxy group, a butoxy group, a pentoxy group, or the like);

a C$_1$-C$_{10}$ alkyl group and a C$_1$-C$_{10}$ alkoxy group, each substituted with at least one substituent selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a pyrenyl group; and a phenyl group, a naphthyl group, an anthryl group, a fluorenyl group, and a pyrenyl group, each substituted with at least one substituent selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a C$_1$-C$_{10}$ alkyl group, and a C$_1$-C$_{10}$ alkoxy group, but are not limited thereto;

R$_{59}$ in Formula 300 may be a phenyl group, a naphthyl group, an anthryl group, a biphenyl group, a pyridyl group;

a phenyl group, a naphthyl group, an anthryl group, a biphenyl group, or a pyridyl group, each substituted with at least one substituent selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a substituted or unsubstituted C$_1$-C$_{20}$ alkyl group, and a substituted or unsubstituted C$_1$-C$_{20}$ alkoxy group.

According to an embodiment of the present invention, the compound represented by Formula 300 may be represented by Formula 300A below, but is not limited thereto:

<Formula 300A>

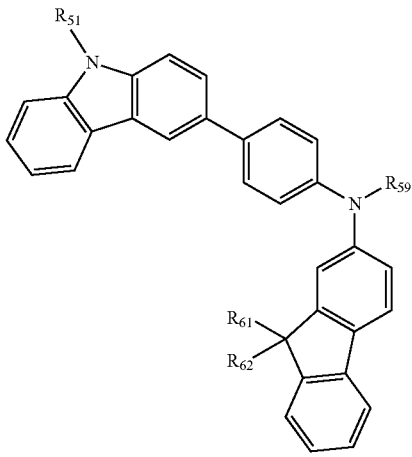

A detailed description of R$_{51}$, R$_{59}$, R$_{61}$ and R$_{62}$ in Formula 300A is already described above.

For example, at least one layer selected from the hole injection layer, the hole transport layer, and the H-functional layer may include at least one selected from Compounds 301 to 320, but these layers may instead include other compounds:

301

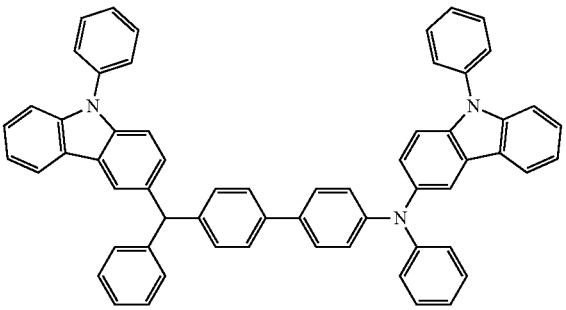

302

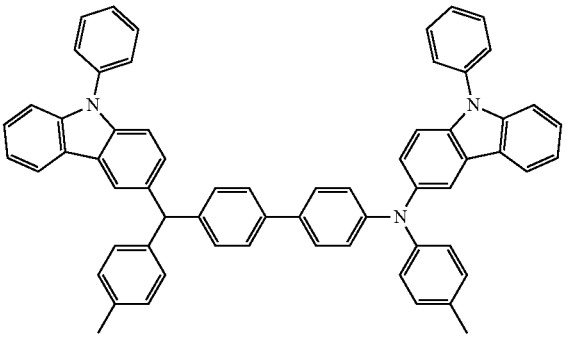

303
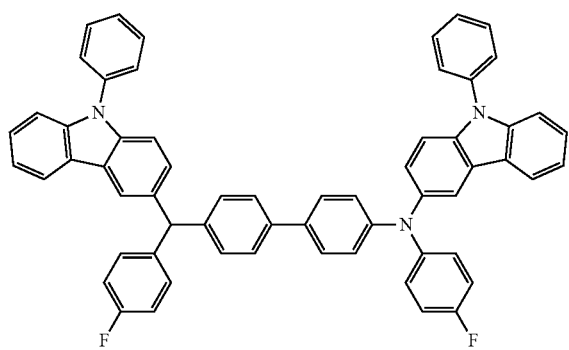
304
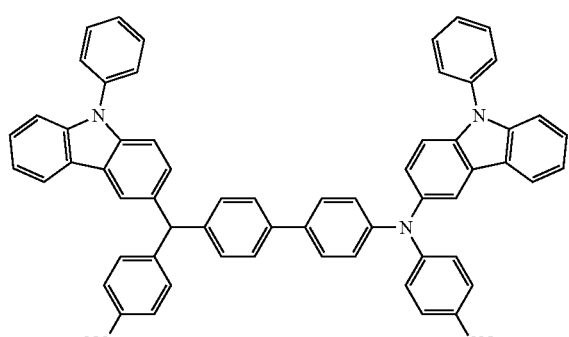
305
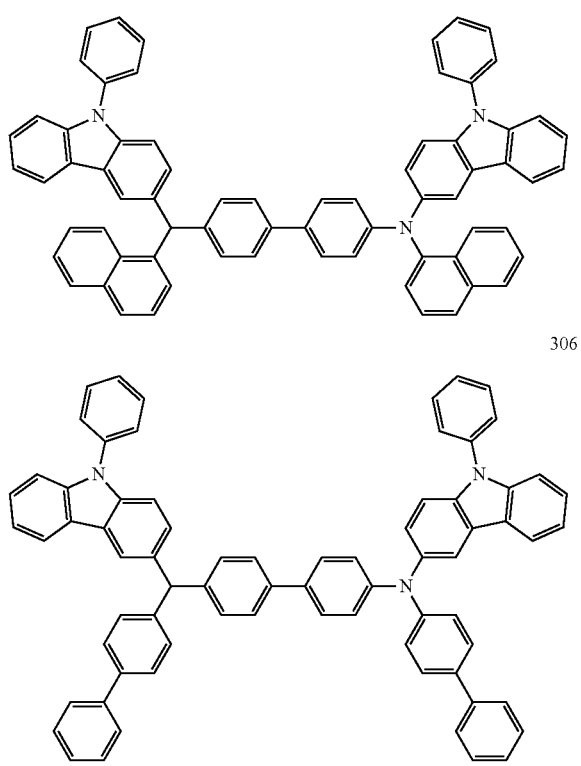
306
307
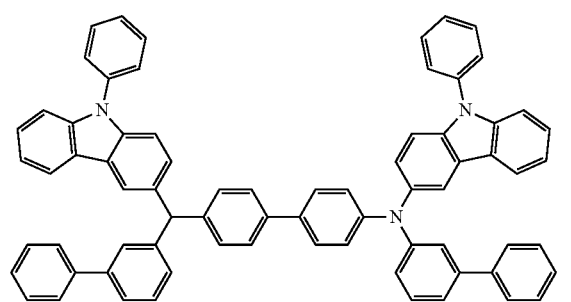
308
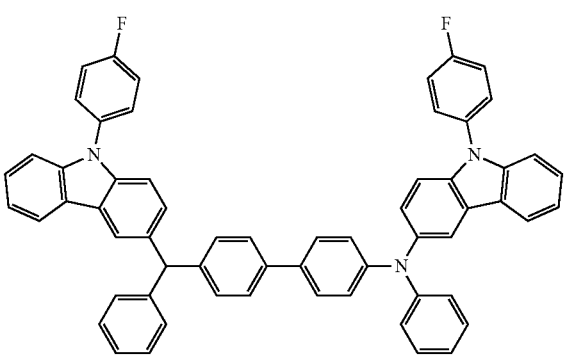
309
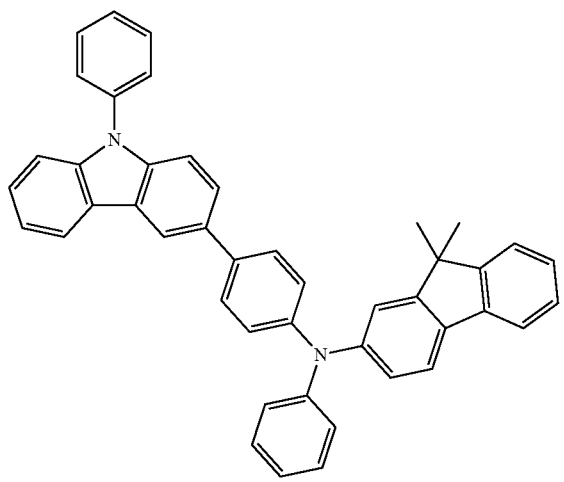

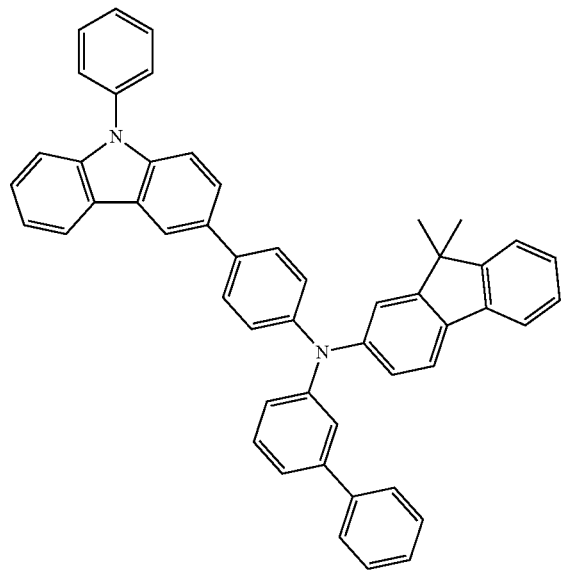
310
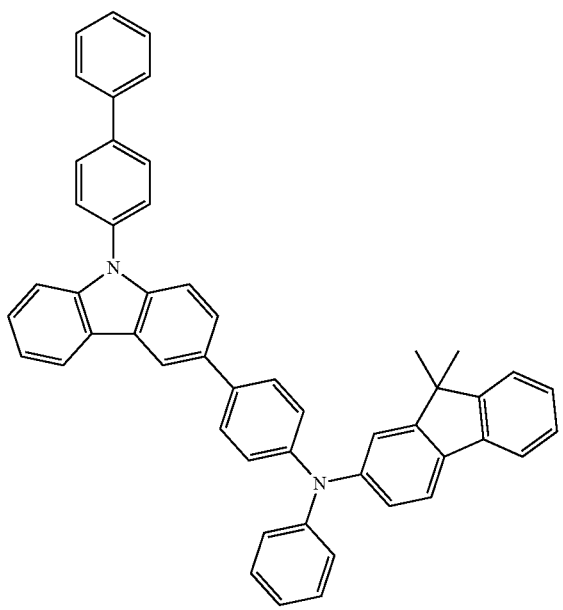
312
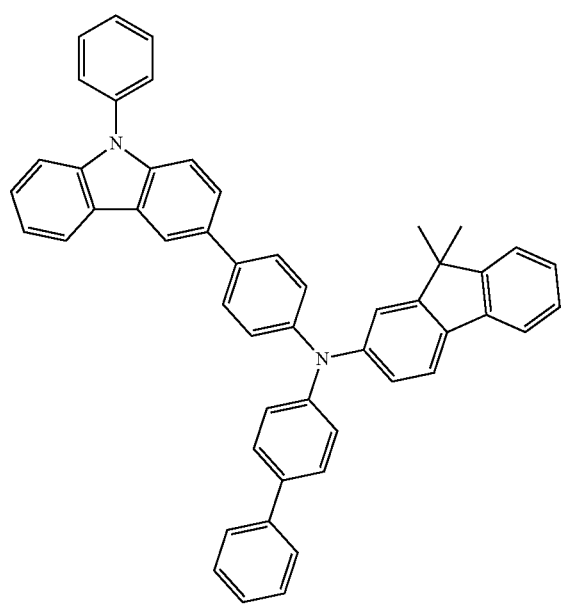
311
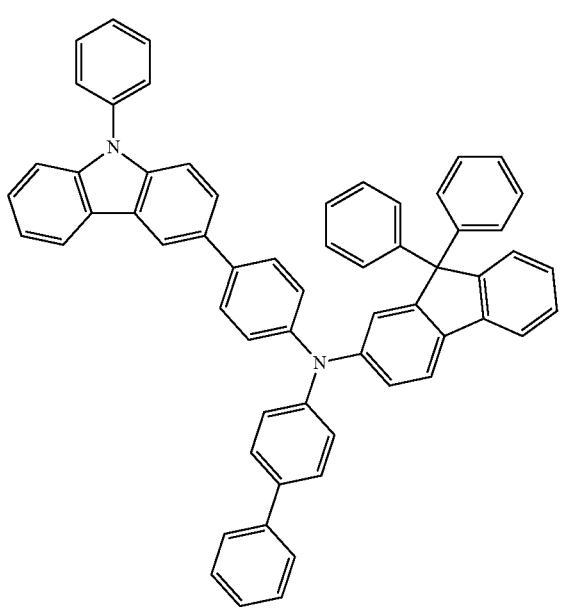
313

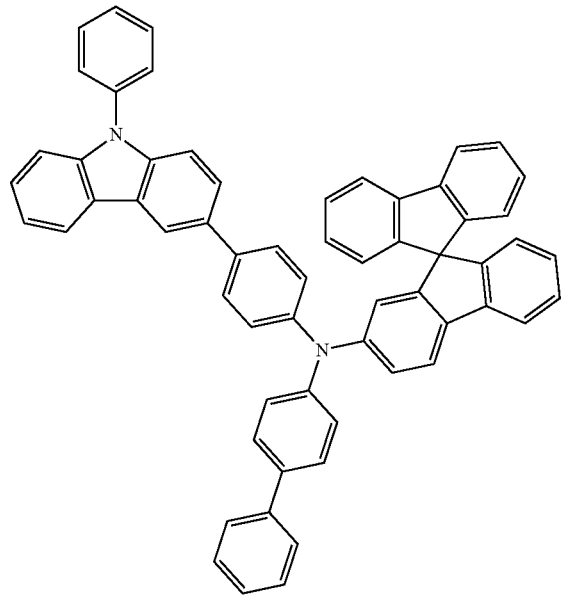
314
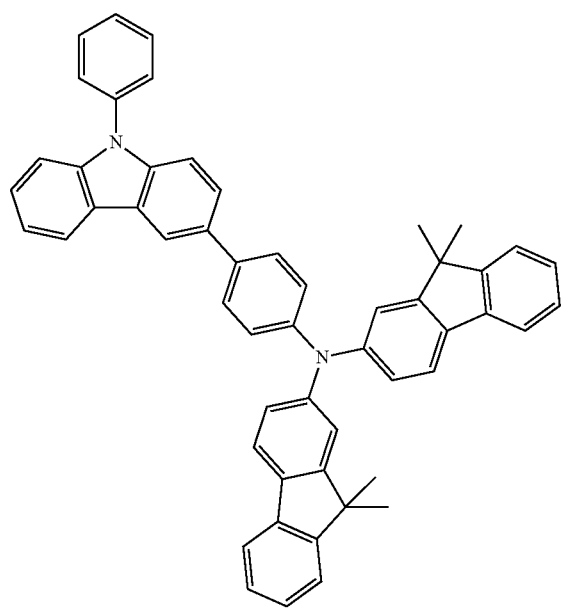
315
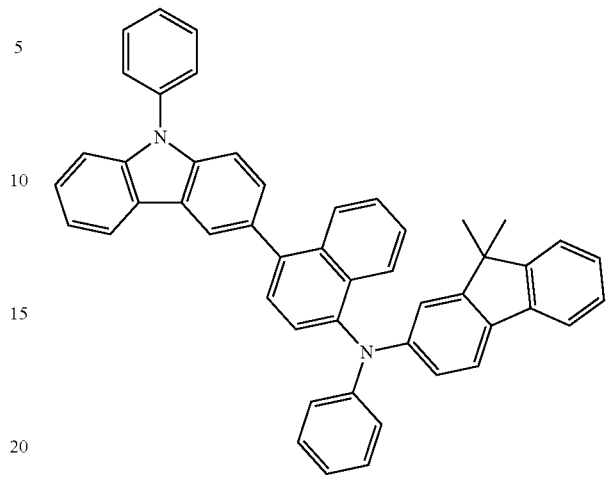
316
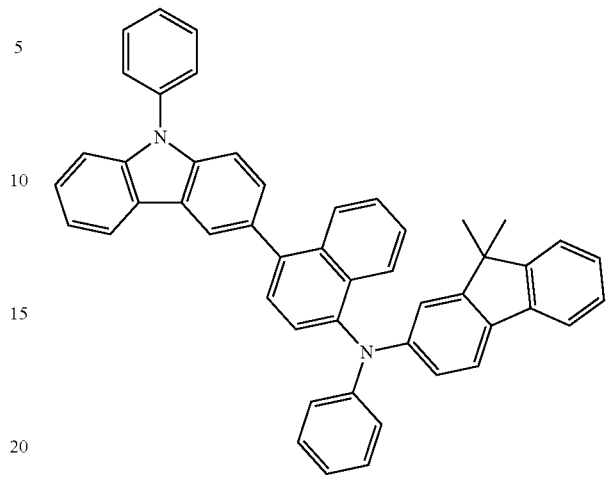
317
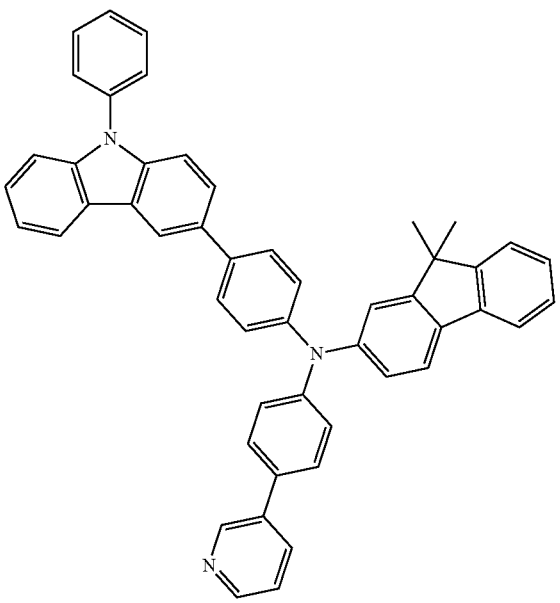
318

319

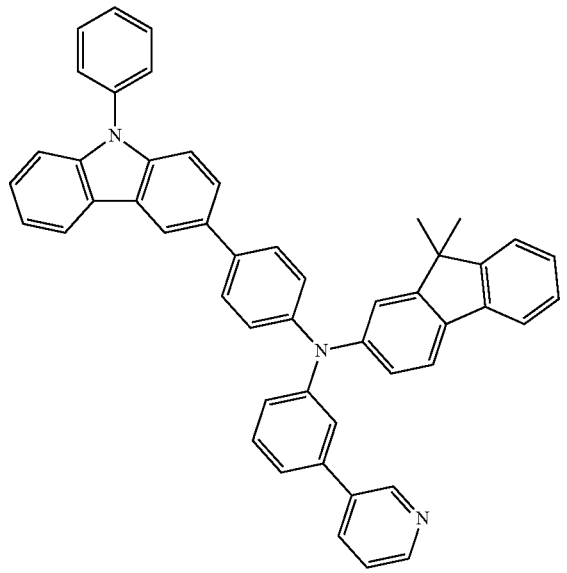

320

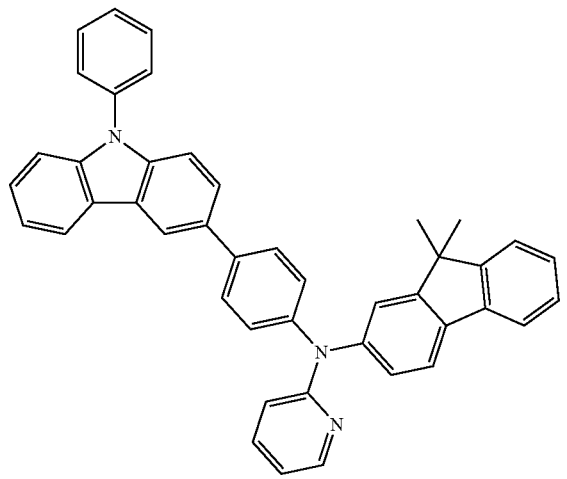

At least one layer selected from the hole injection layer, the hole transport layer, and the H-functional layer, in addition to such suitable hole injection materials, such suitable hole transport materials, and/or such materials having a hole injection function and a hole transport function, the at least one layer may further include a charge-generating material to increase the conductivity of a film.

The charge-generation material may be, for example, a p-dopant. The p-dopant may be a quinone derivative, a metal oxide, and a cyano group-containing compound, but is not limited thereto. For example, non-limiting examples of the p-dopant are a quinone derivative, such as tetracyanoquinonedimethein (TCNQ) and 2,3,5,6-tetrafluoro-tetracyano-1,4-benzoquinonedimethein (F4-TCNQ), or the like; a metal oxide, such as a tungsten oxide and a molybdenum oxide; and a cyano group-containing compound, such as Compound 200 below, but are not limited thereto.

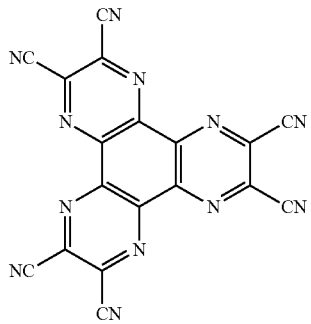

<Compound 200>

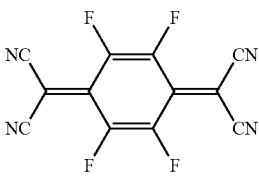

<F4-TCNQ>

In one embodiment, when the HIL, the HTL, or the H-functional layer further includes the charge-generating material, the charge-generating material may be, for example, homogeneously or non-homogeneously distributed in the HIL, the HTL, or the H-functional layer.

A buffer layer may be disposed between the emission layer and at least one of the HIL, the HTL, and the H-functional layer. Also, the buffer layer may compensate an optical resonance distance according to a wavelength of light emitted from the emission layer, and efficiency of a formed organic light-emitting device may be improved. The buffer layer may include a suitable hole injection material and a hole transportation material. Also, the buffer layer may include a material that is the same as a material included in the HIL, the HTL, and the H-functional layer formed under the buffer layer.

Subsequently, an emission layer (EML) may be formed on the HTL, the H-functional layer, or the buffer layer by vacuum deposition, spin coating, casting, LB deposition, etc. If the EML is formed by vacuum deposition or spin coating, the deposition or coating conditions may be similar to those applied to form the HIL, although they may vary according to the material that is used to form the EML.

The EML may be formed by using various suitable luminescent materials, for example, a suitable host and a suitable dopant. A dopant for use in the EML may be a suitable fluorescent dopant and a suitable phosphorescent dopant.

As the host, $Alq_3$, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), E3, distyrylarylene (DSA), dmCBP (see the following chemical structure), Compounds 501 to 509 illustrated below, or the like may be used, but other suitable materials may instead be used as the host.

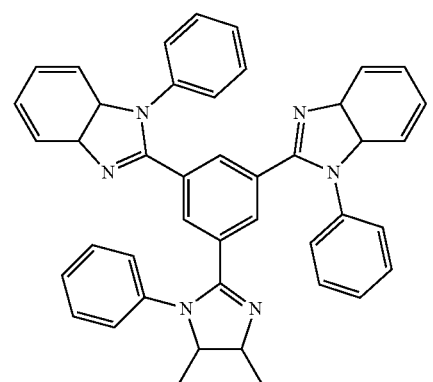
TPBI
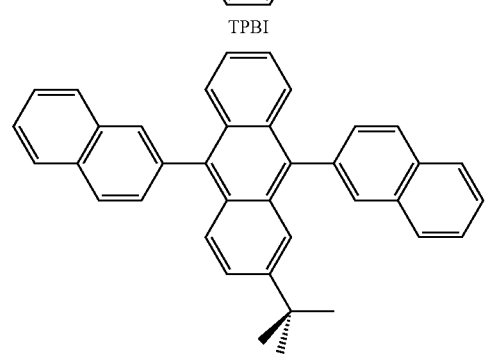
TBADN
E3
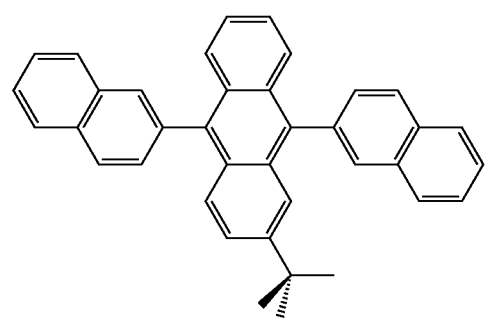
PVK
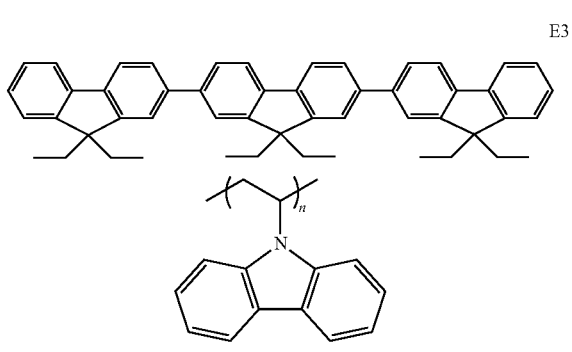
ADN
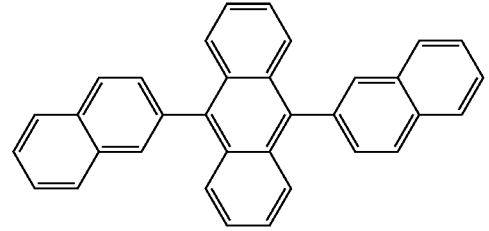
CBP
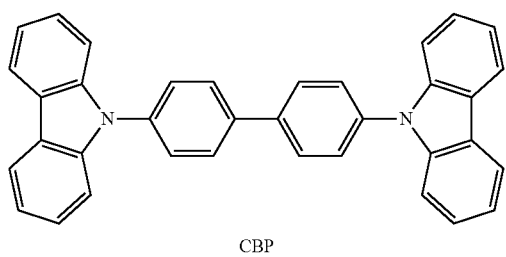
dmCBP
501
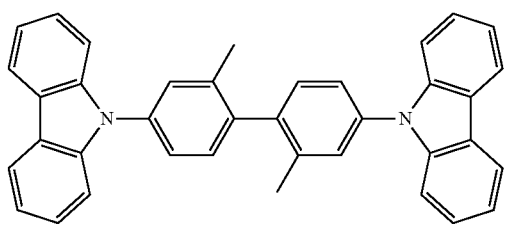
502
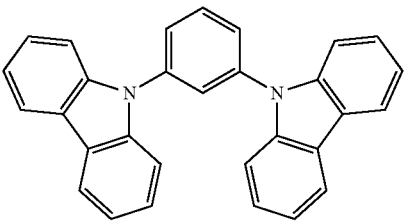
503
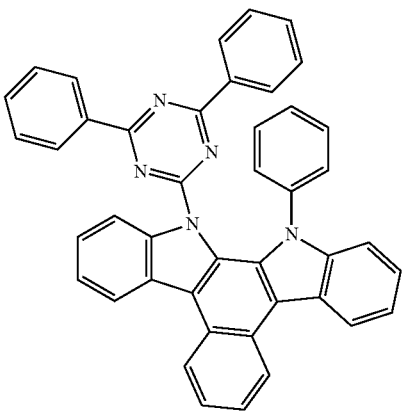

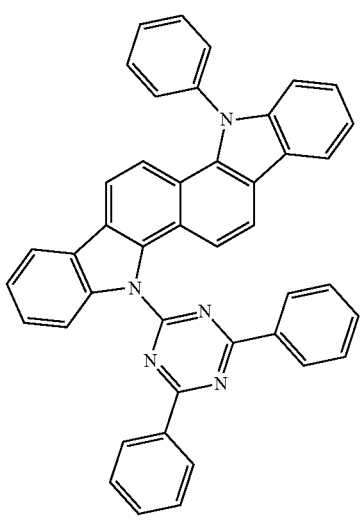

504

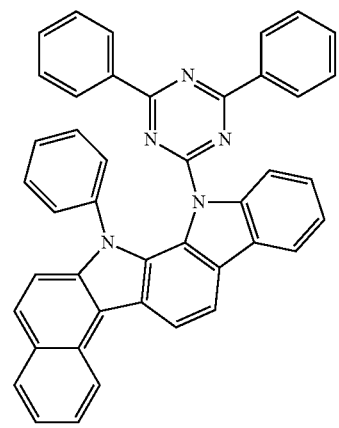

505

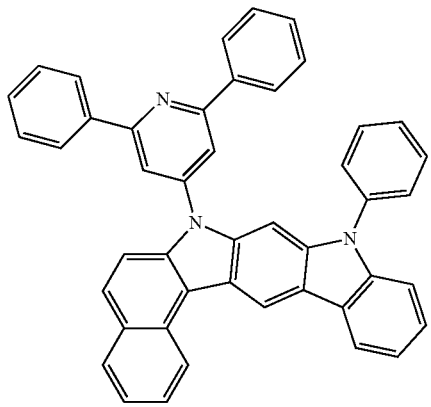

506

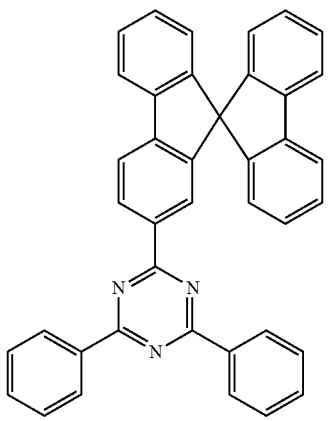

507

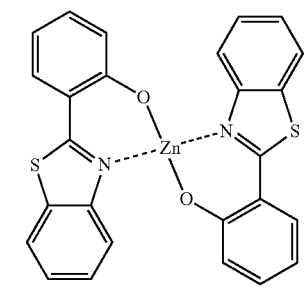

508

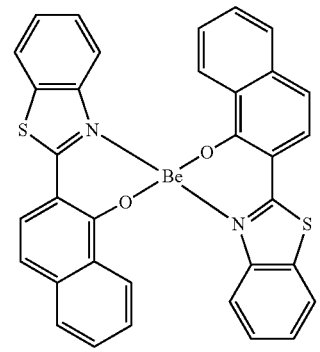

509

Also, as the host, an anthracene-based compound represented by Formula 400 below may be used.

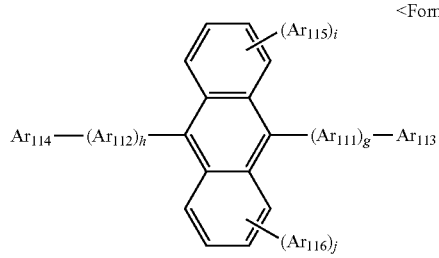

<Formula 400>

In Formula 400, $Ar_{111}$ and $Ar_{112}$ are, each independently, a substituted or unsubstituted $C_5$-$C_{60}$ arylene group; $Ar_{113}$ to $Ar_{116}$ are, each independently, a substituted or unsubstituted $C_1$-$C_{10}$ alkyl group or a substituted or unsubstituted $C_5$-$C_{60}$ aryl group; and g, h, i and j are, each independently, an integer of 0 to 4.

For example, $Ar_{111}$ and $Ar_{112}$ in Formula 400 may be phenylene, naphtylene, phenanthrenylene, pyrenylene; or phenylene, naphtylene, phenanthrenylene, fluorenyl group, or pyrenylene, each substituted with at least one substituent selected from a phenyl group, a naphthyl group and an anthryl group, but is not limited thereto.

g, h, l, and j in Formula 400 may be, each independently, 0, 1, or 2.

$Ar_{113}$ to $Ar_{116}$ in Formula 400 are, each independently, a $C_1$-$C_{10}$ alkyl group, substituted with at least one substituent selected from a phenyl group, a naphthyl group, and an anthryl group;

a phenyl group, a naphthyl group, an anthryl group, a pyrenyl group, a phenanthrenyl group, a fluorenyl group;

a phenyl group, a naphthyl group, an anthryl group, a pyrenyl group, a phenanthrenyl group and a fluorenyl group, each substituted with at least one substituent selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group and a fluorenyl group; or

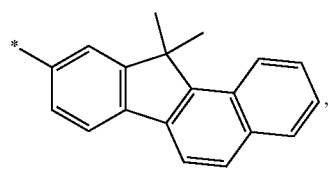 [SMILES: *c1ccc2c(c1)C(C)(C)c1c-2ccc2ccccc12]

but is not limited thereto.

For example, the anthracene-based compound represented by Formula 400 may be any one of compounds below, but is not limited thereto.

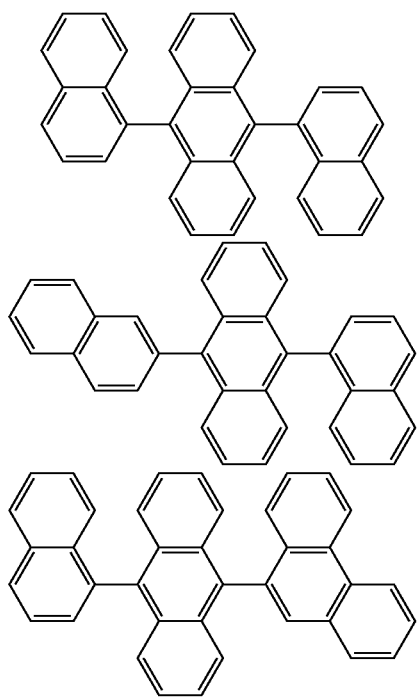

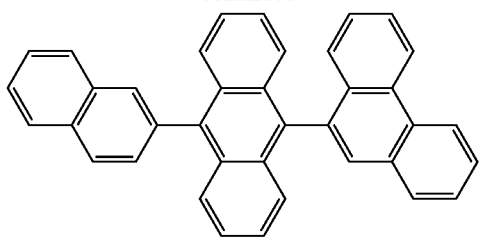

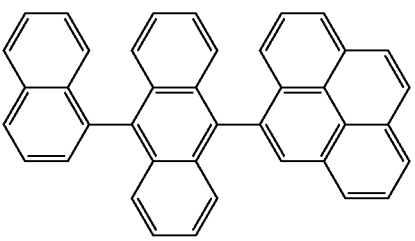

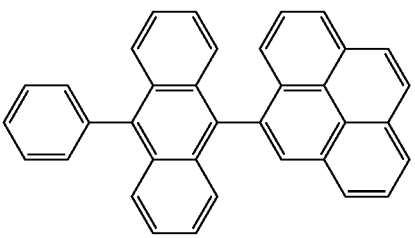

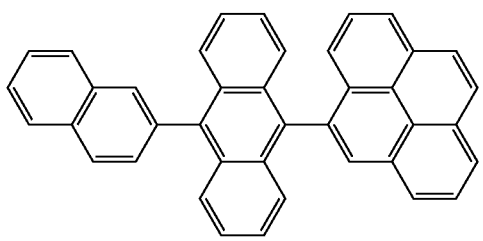

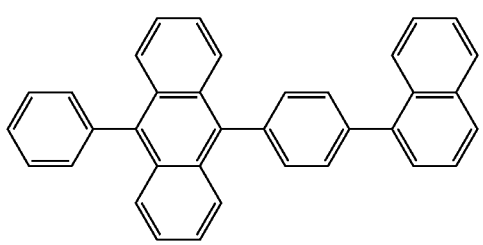

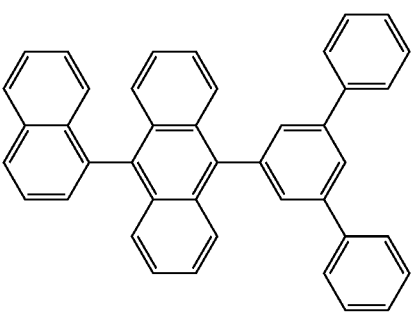

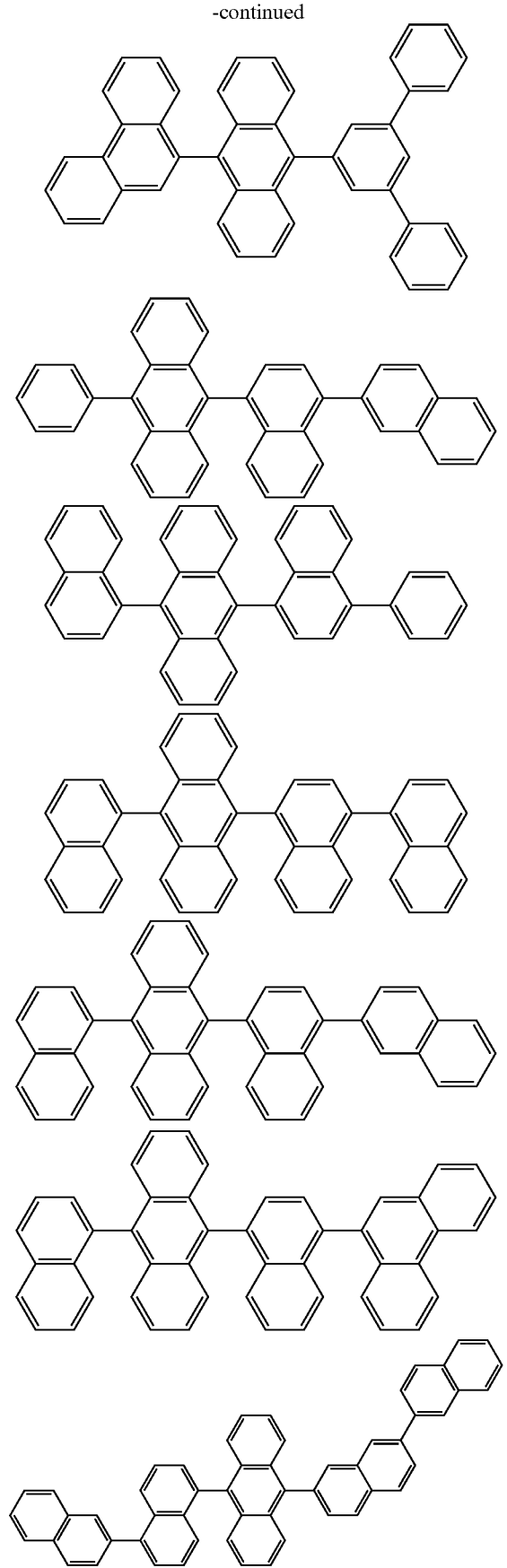

37
-continued
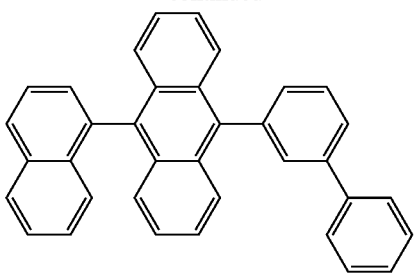
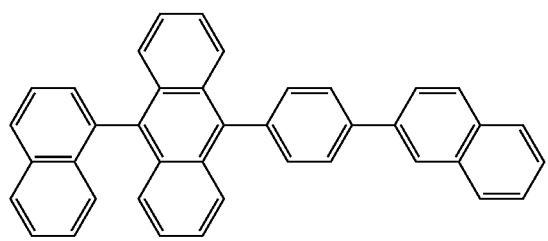
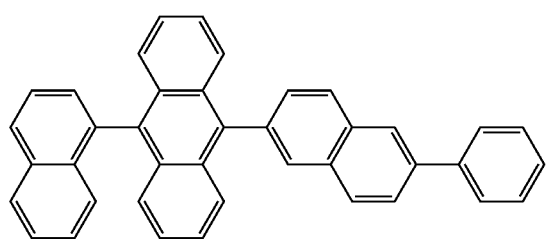
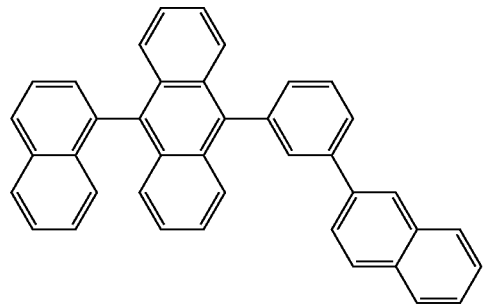
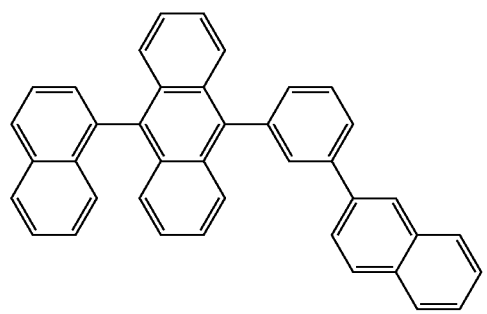
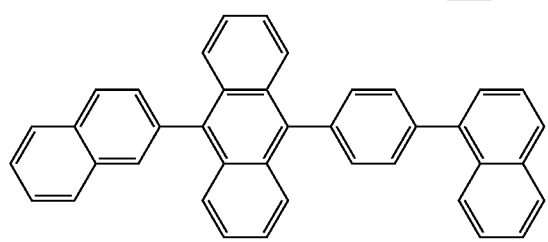
38
-continued
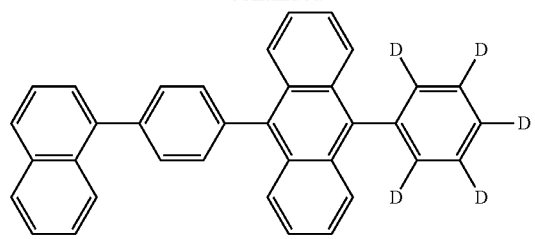
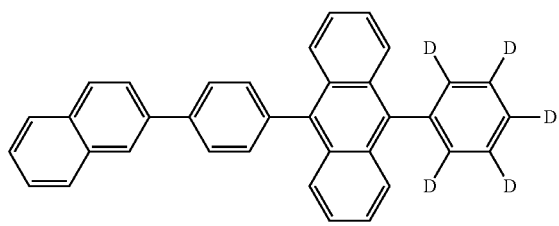
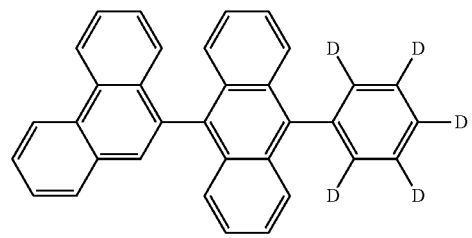
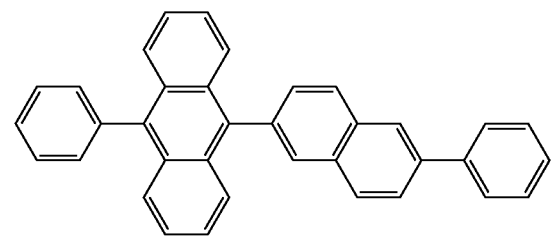
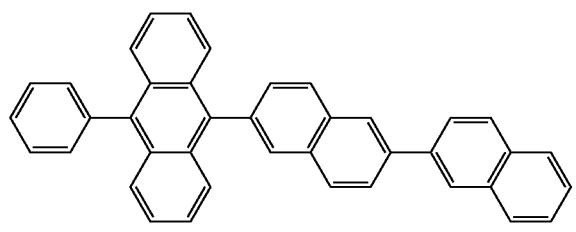
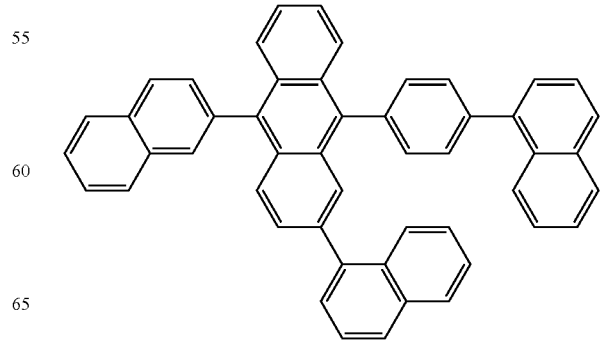

-continued

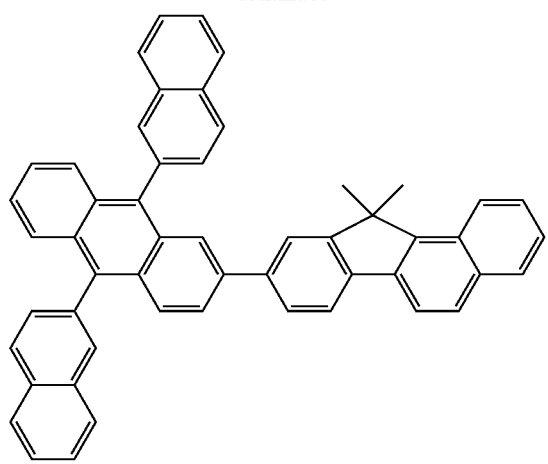

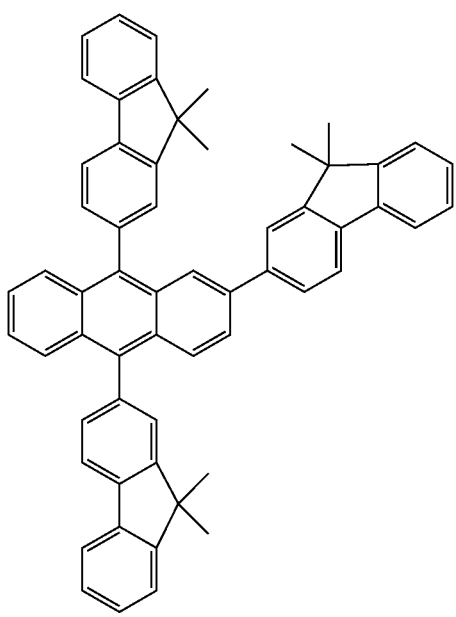

-continued

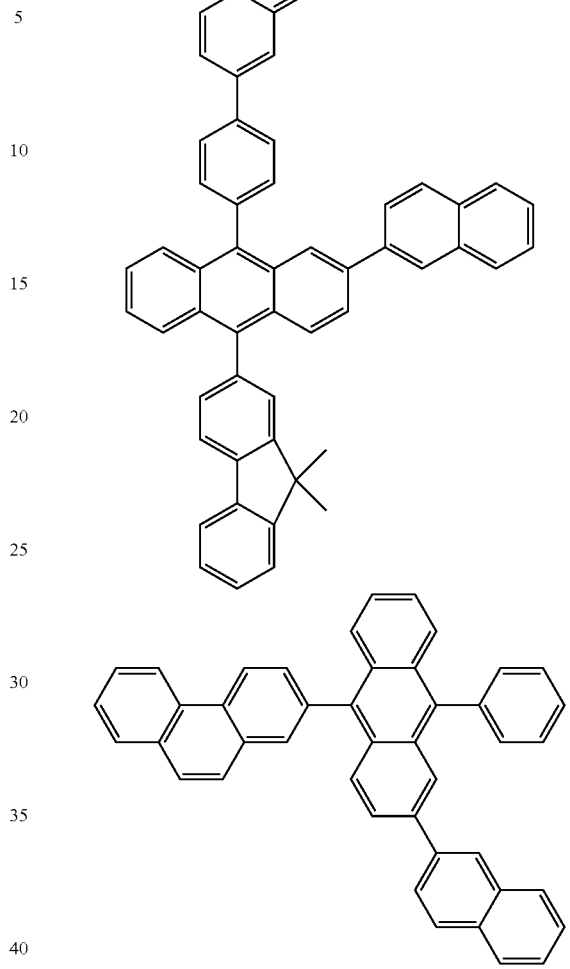

According to another embodiment of the present invention, as the host, an anthracene-based compound represented by Formulae 401 below may be used:

<Formula 401>

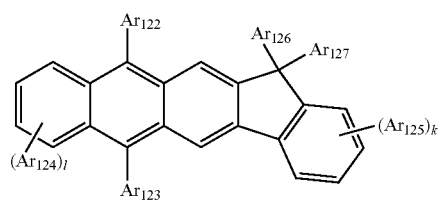

$Ar_{122}$ to $Ar_{125}$ in Formula 401 may be, each independently, selected from the same chemical groups as those with reference to the description of $Ar_{113}$ to $Ar_{116}$ in Formulae 400;

$Ar_{126}$ and $Ar_{127}$ in Formula 401 may be, each independently, a $C_1$-$C_{10}$ alkyl group (for example, a methyl group, an ethyl group, or a propyl group);

k and l in Formula 401 may be, each independently, an integer of 0 to 4. For example, k and l may be an integer of 0, 1, or 2.

For example, the anthracene-based compound represented by Formula 401 may be one of the following compounds, but is not limited thereto:

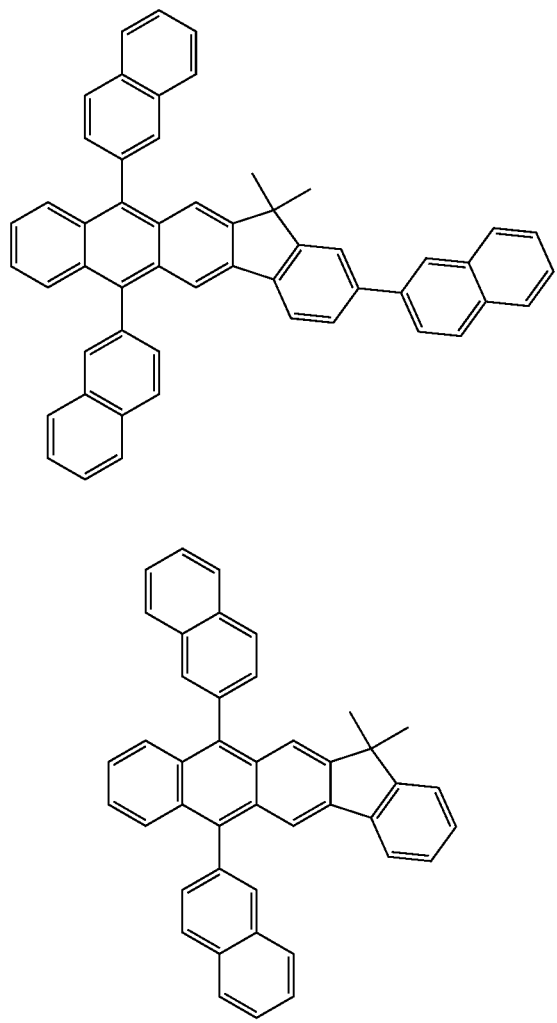

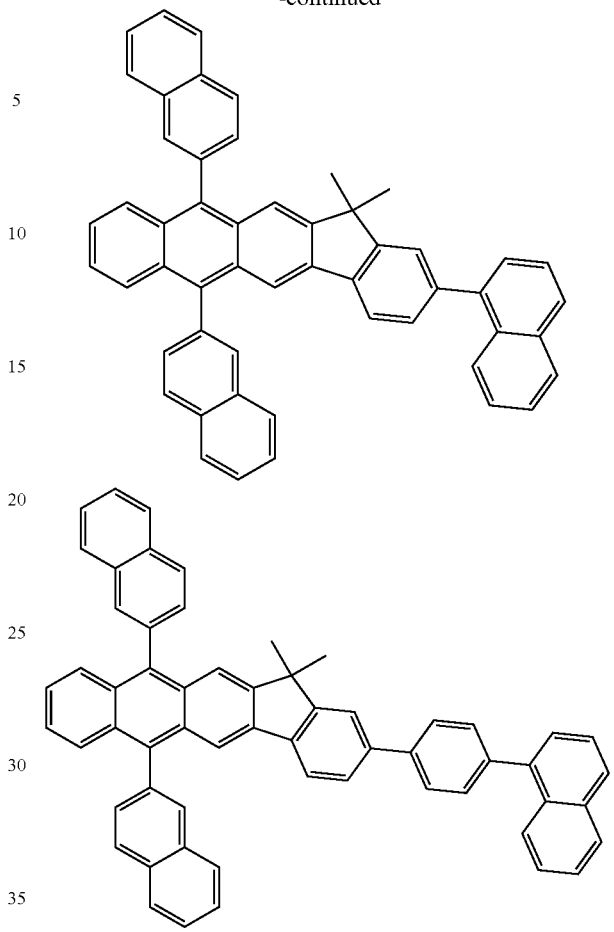

When the organic light-emitting device is a full color organic light-emitting device, the emission layer may be patterned into a red emission layer, a green emission layer, and a blue emission layer.

Also, at least one of the red emission layer, the green emission layer, and the blue emission layer may include a dopant (ppy=phenylpyridine).

For example, the following compounds may be used as a blue dopant, but the blue dopant is not limited thereto.

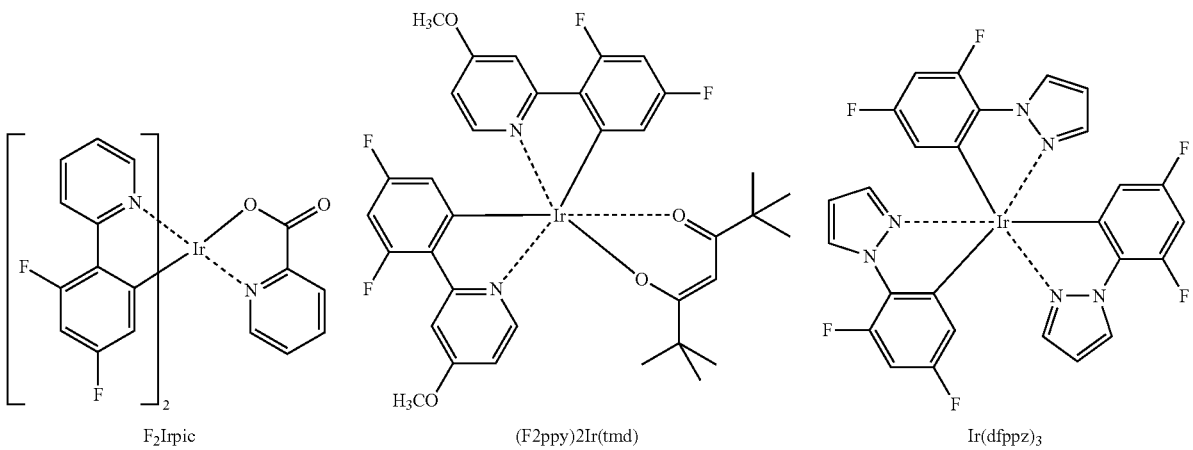

F₂Irpic          (F2ppy)2Ir(tmd)          Ir(dfppz)₃

-continued
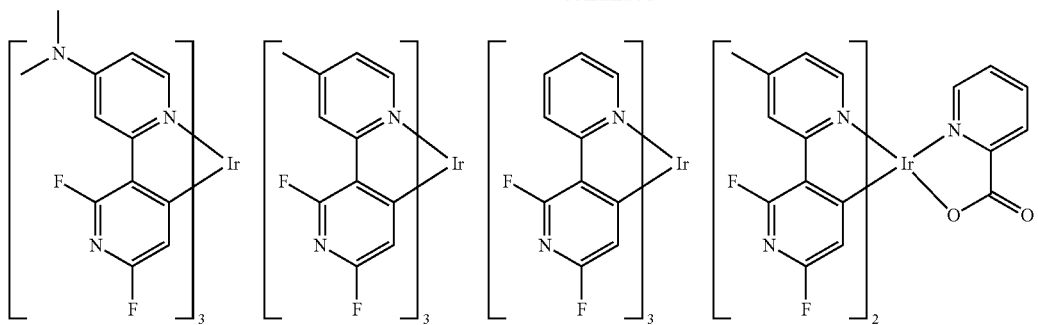
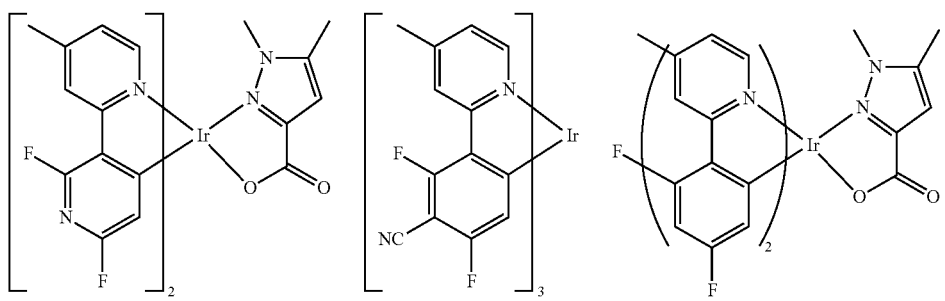
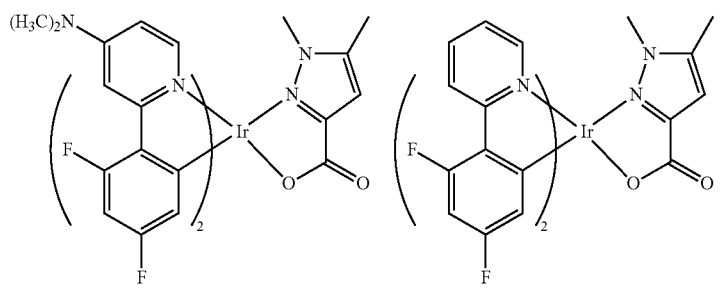
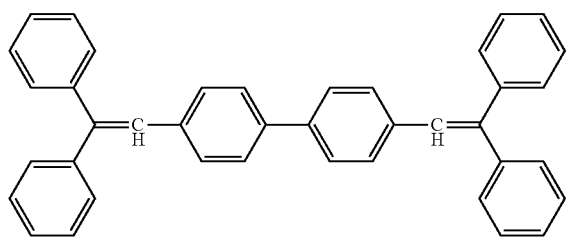
DPVBi
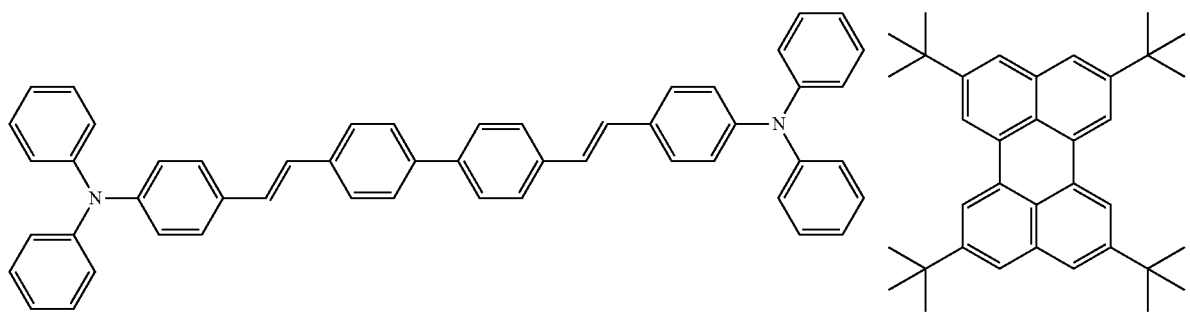
DPAVBi
TBPe For example, compounds illustrated below may be used as a red dopant, but the red dopant is not limited thereto.
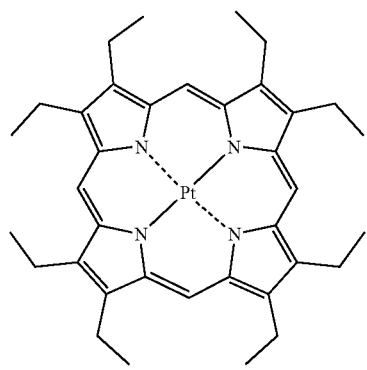
PtOEP
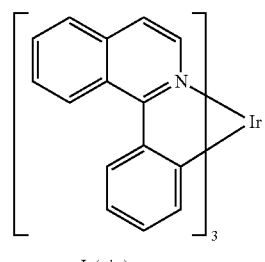
Ir(piq)₃
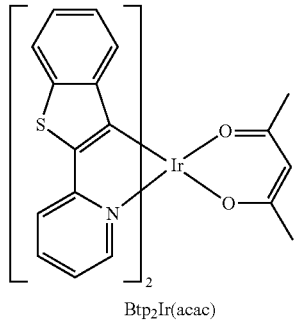
Btp₂Ir(acac)
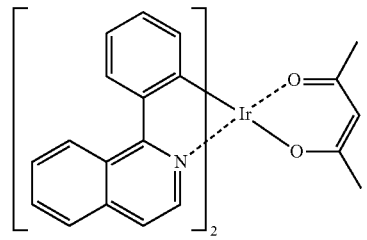
Ir(pq)₂(acac)
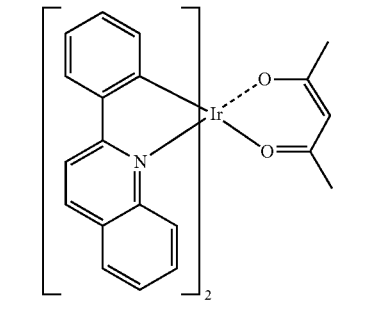
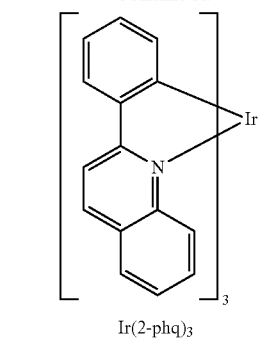
Ir(2-phq)₃
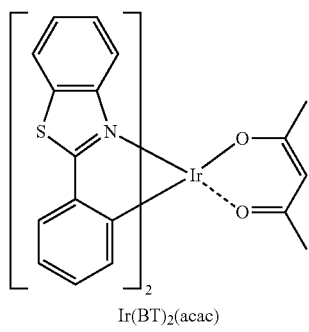
Ir(BT)₂(acac)
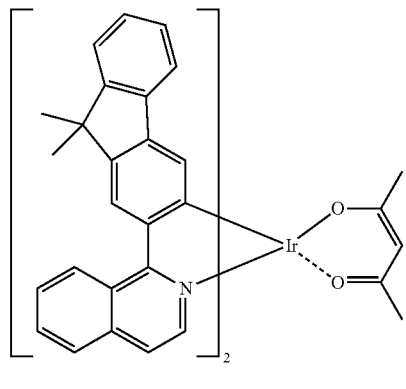
Ir(fliq)₂(acac)
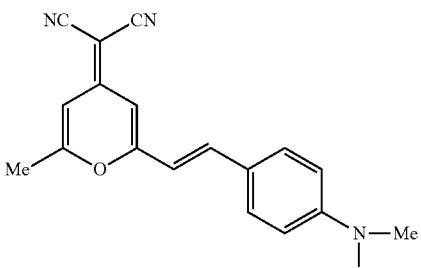
DCM -continued
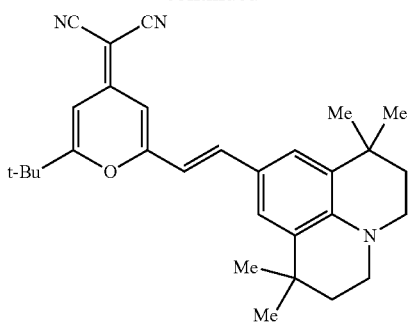
DCJTB
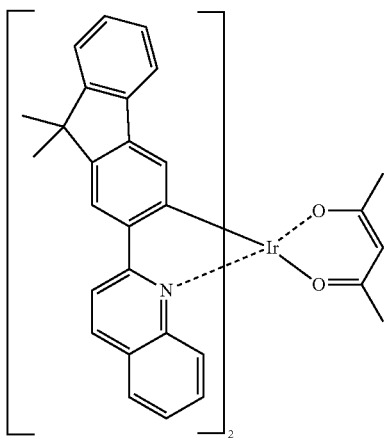
Ir(flq)$_2$(acac)
For example, compounds illustrated below may be used as a green dopant, but the green dopant is not limited thereto.
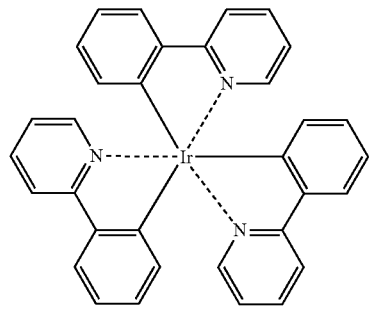
Ir(ppy)$_3$
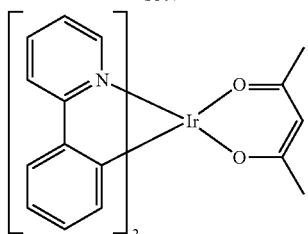
Ir(ppy)$_2$(acac)
-continued
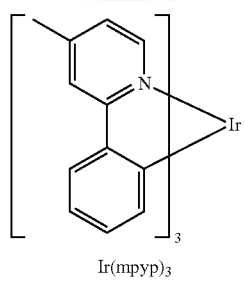
Ir(mpyp)$_3$
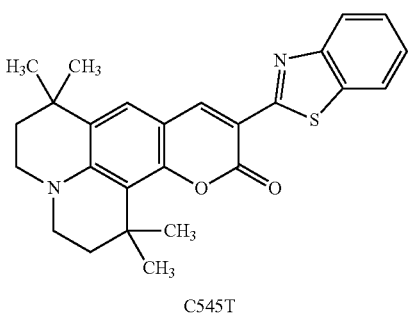
C545T
Also, another example of the dopant included in the emission layer is a Pd-complex or Pt-complex below, but the dopant is not limited thereto.
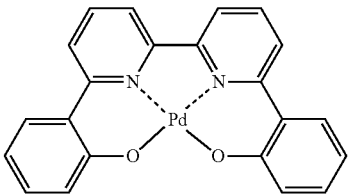
D1
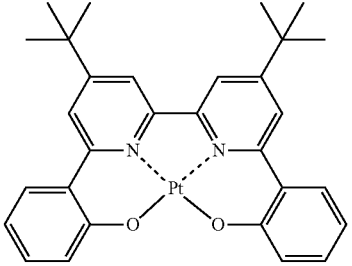
D2
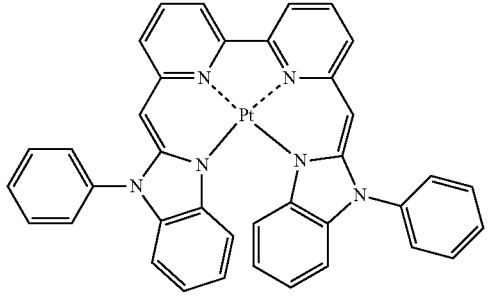
D3

D4
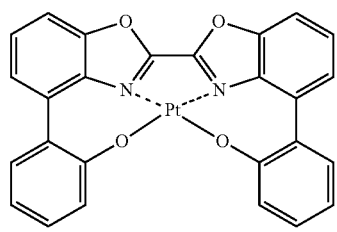
D5
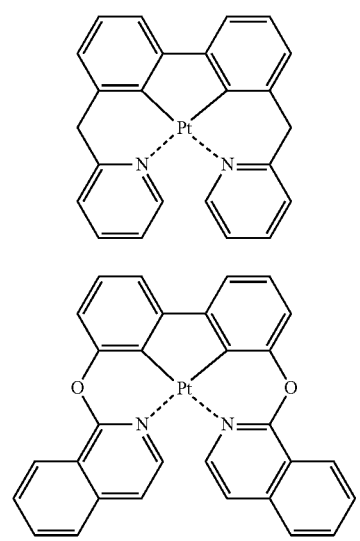
D6
D7
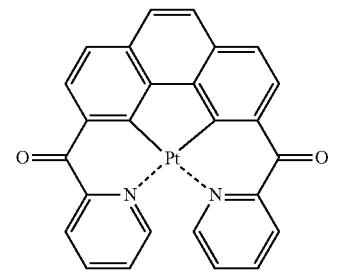
D8
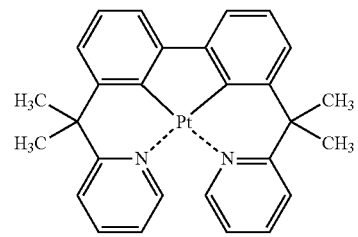
D9
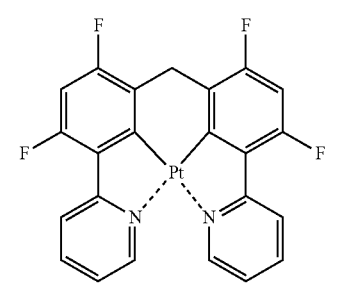
D10
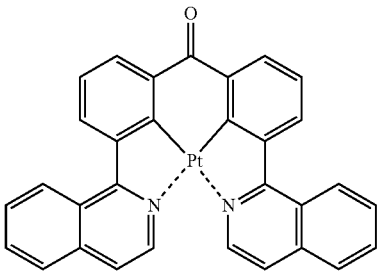
D11
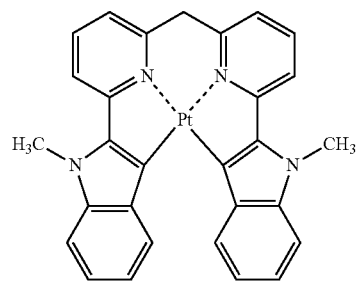
D12
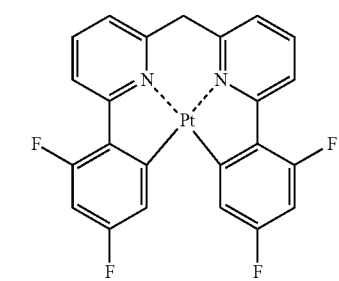
D13
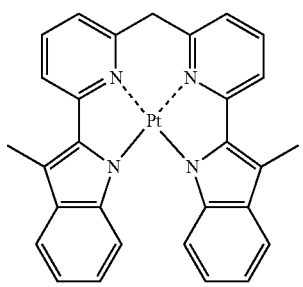
D14
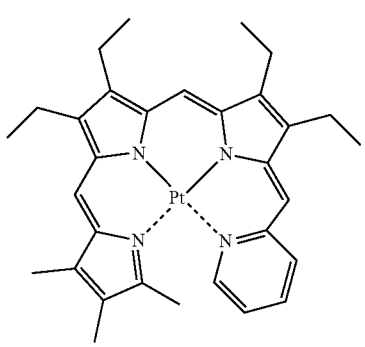

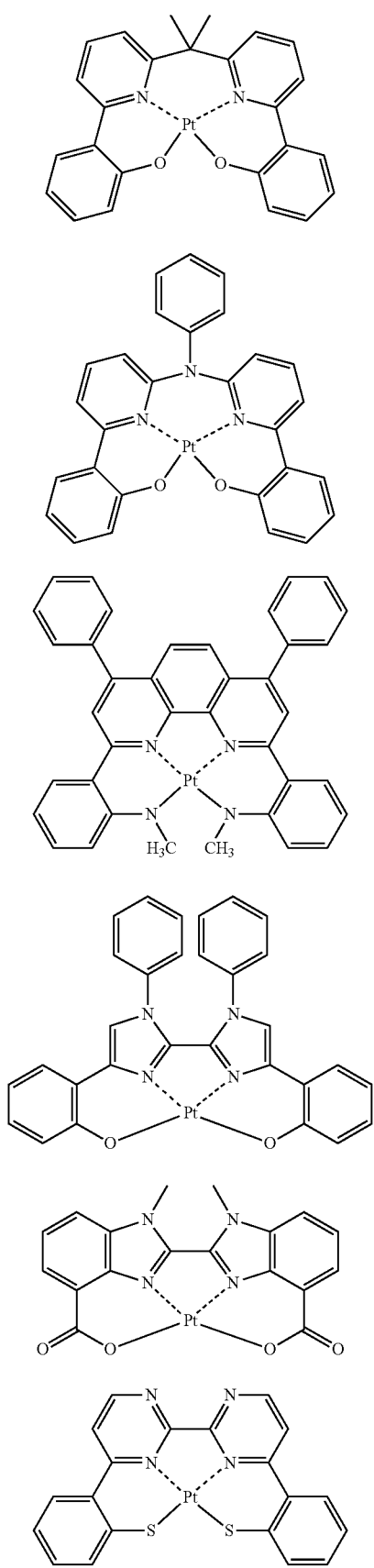

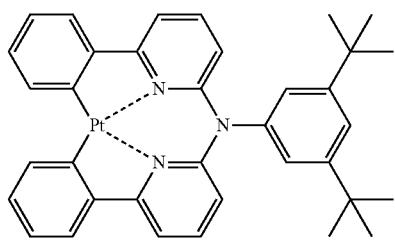
D26
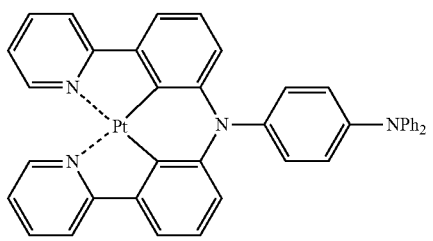
D32
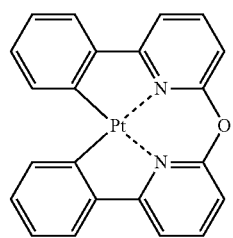
D27
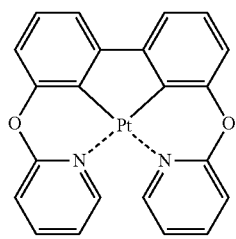
D33
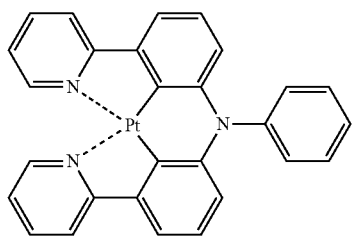
D28
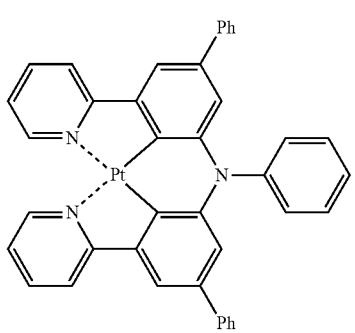
D34
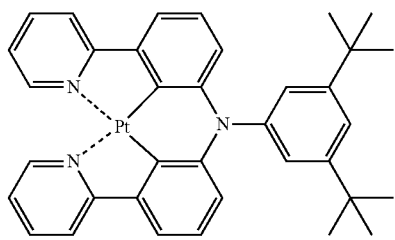
D29
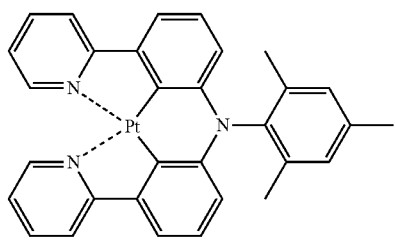
D30
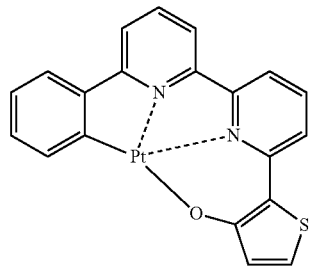
D35
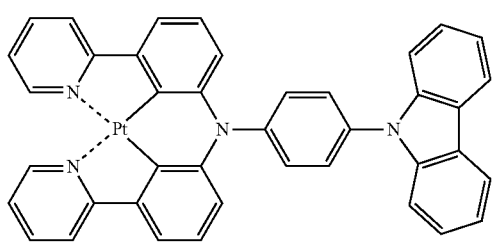
D31
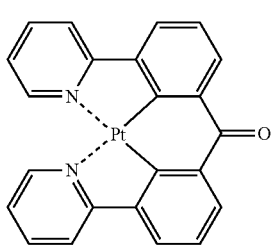
D36

-continued
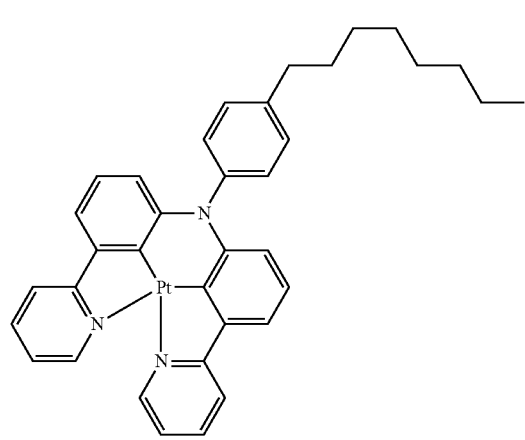
D37
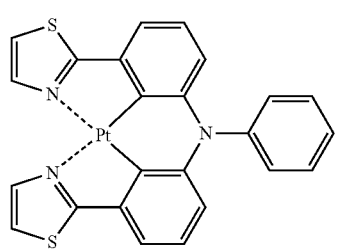
D38
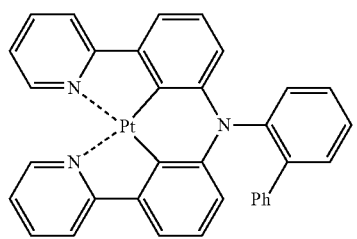
D39
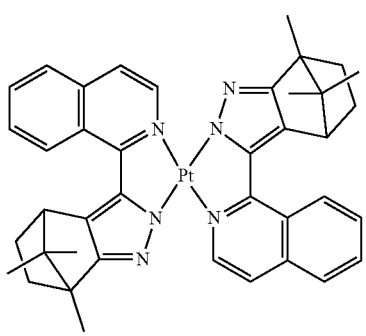
D40
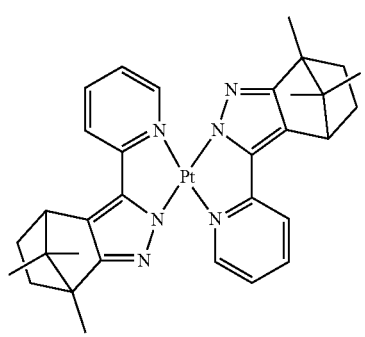
D41
-continued
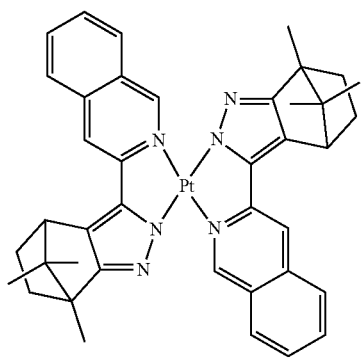
D42
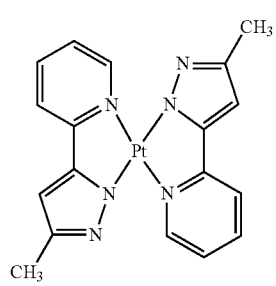
D43
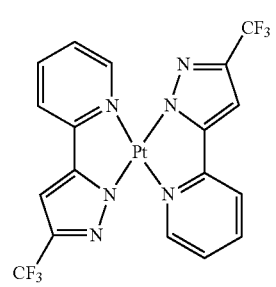
D44
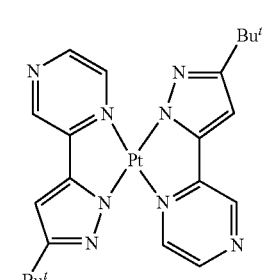
D45
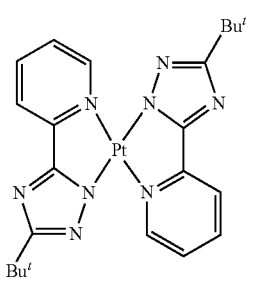
D46

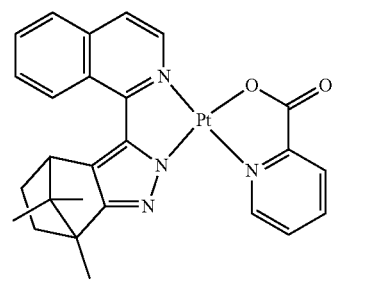

D47

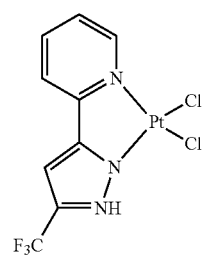

D48

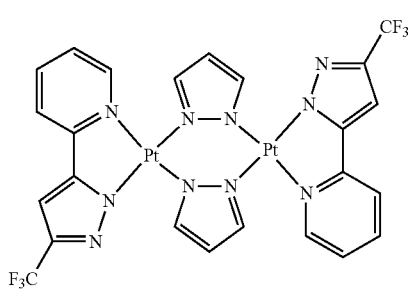

D49

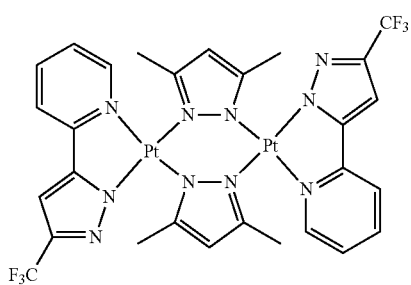

D50

Also, another example of the dopant included in the emission layer is an Os-complex below, but the dopant is not limited thereto.

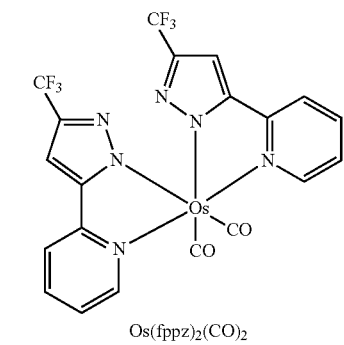

Os(fppz)$_2$(CO)$_2$

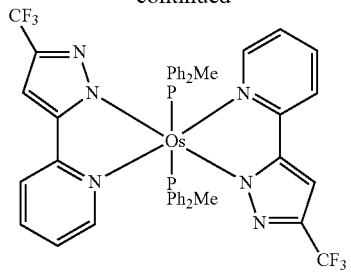

Os(fppz)$_2$(PPh$_2$Me)$_2$

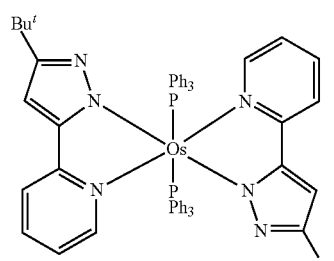

Os(bppz)$_2$(PPh$_3$)$_2$

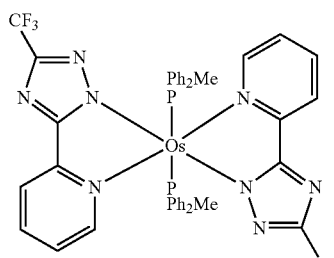

Os(fptz)$_2$(PPh$_2$Me)$_2$

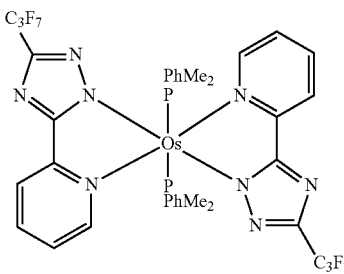

Os(hptz)$_2$(PPh$_2$Me$_2$)$_2$

When the EML includes a host and a dopant, an amount of the dopant may be from about 0.01 to about 15 parts by weight based on about 100 parts by weight of the host. However, the amount of the dopant is not limited thereto.

A thickness of the EML may be in a range of about 100 Å to about 1000 Å, for example, about 200 Å to about 600 Å. In one embodiment, when the thickness of the EML is within these ranges, excellent luminescent characteristics are obtained without a substantial increase in the driving voltage.

Next, an electron transport layer (ETL) is formed on the EML using various methods, for example, by vacuum deposition, spin coating, casting, or the like. If the ETL is formed by vacuum deposition or spin coating, the deposition or coating conditions may be similar to those applied to form the HIL, although the deposition or coating conditions may vary according to the material that is used to form the ETL. A material for forming the ETL may be a material that stably transports electrons injected from an electron injection electrode (cathode), and such a material may be chosen from suitable electron transport materials. Examples of a suitable electron transportation material are a quinoline derivative, such as tris(8-quinolinorate)aluminum (Alq3), TAZ, Balq, beryllium bis(benzoquinolin-10-olate) (Bebq$_2$), ADN, Compound 201, and Compound 202, but are not limited thereto.

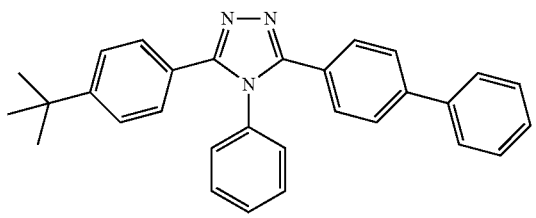

TAZ

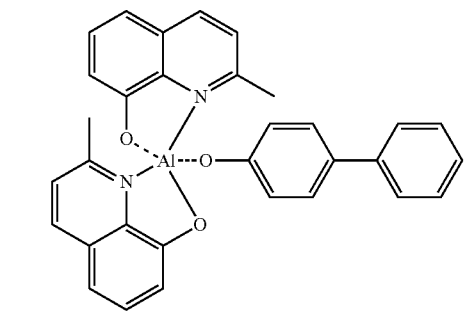

BAlq

<Compound 201>

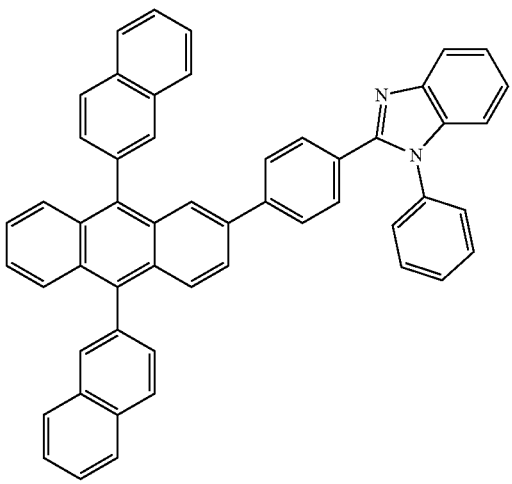

<Compound 202>

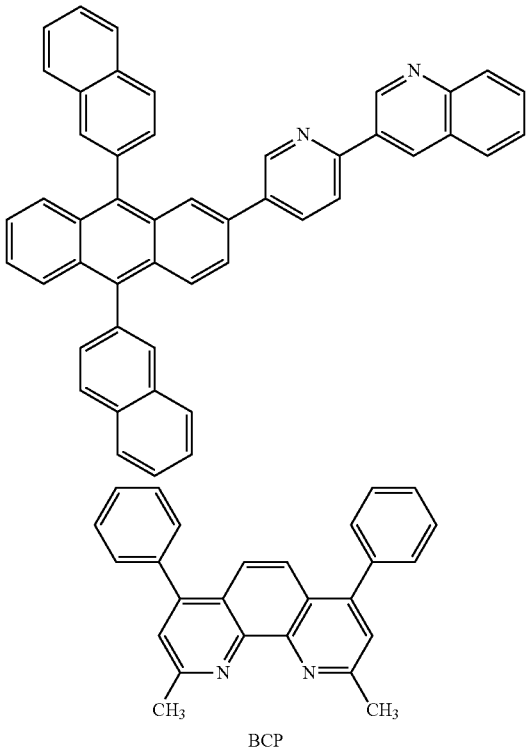

BCP

A thickness of the ETL may be in a range of about 100 Å to about 1000 Å, for example, about 150 Å to about 500 Å. In one embodiment, when the thickness of the ETL is within the range described above, the hole injection layer has satisfactory electron transportation characteristics without a substantial increase in the driving voltage.

Also, the ETL may include, in addition to a suitable electron transport organic compound, a metal-containing material.

The metal-containing material may include a Li complex. Non-limiting examples of the Li complex are lithium quinolate (LiQ) and Compound 203 below:

<Compound 203>

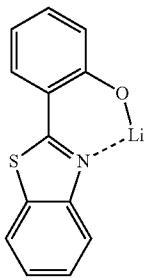

Also, a material that may allow electrons to be easily injected from an anode may be deposited on the electron transport layer to form an electron injection layer (EIL), but the material is not particularly limited.

The material for forming the EIL may be any one of various suitable materials including LiF, NaCl, CsF, Li$_2$O, and BaO. The deposition conditions of the EIL may vary according to the material that is used to form the EIL, although they are similar to those applied to form the HIL.

A thickness of the EIL may be in a range of about 1 Å to about 100 Å, for example, about 3 Å to about 90 Å. In one embodiment, when the thickness of the EIL is within the ranges described above, the EIL has satisfactory electron transportation characteristics without a substantial increase in the driving voltage.

The second electrode may be disposed on the organic layer. The second electrode may be a cathode, which is an electron injection electrode. A material for forming the second electrode may be a metal, an alloy, an electrically conductive compound, each having a low-work function, or a mixture thereof. For example, lithium (Li), magnesium (Mg), aluminum (Al), aluminum-lithium (Al—Li), calcium (Ca), magnesium-indium (Mg—In), magnesium-silver (Mg—Ag), etc. may be formed as a thin film for use as a transmissive electrode. In some embodiments, to manufacture a top-emission light-emitting device, a transmissive electrode may be formed of indium tin oxide (ITO) or indium zinc oxide (IZO).

A light efficiency-improvement layer may be deposited on the second electrode. The second electrode may be a cathode. The light efficiency-improvement layer may be disposed on the second electrode opposite to the organic layer disposed between the first electrode and the second electrode.

The light efficiency-improvement layer may further include, in addition to the compound according to an embodiment of the present invention, for example, Alq3.

Although deposition conditions of the light efficiency-improvement layer vary according to the material that is used to form the light efficiency-improvement layer, in general, the deposition conditions may be similar to those for the formation of an organic deposition film, such as a HIL.

A thickness of the light efficiency-improvement layer may be in a range of about 400 Å to about 1200 Å, and for example, in the case of a blue emission layer, a thickness of the light efficiency-improvement layer may be in a range of about 400 Å to about 800 Å. In one embodiment, when the thickness of the light efficiency-improvement layer is within these ranges described above, desired external luminescent efficiency is achieved.

Hereinbefore, the organic light-emitting diode has been described with reference to FIG. 1, but is not limited thereto.

Also, when the EML includes a phosphorescent dopant, a hole blocking layer (HBL) may be formed between the ETL and the EML or between the E-functional layer and the EML by vacuum deposition, spin coating, casting, LB deposition, etc. so as to prevent diffusion of triplet excitons or holes into the electron transport layer. If the HBL is formed by vacuum deposition or spin coating, the deposition or coating conditions may be similar to those applied to form the HIL, although the deposition or coating conditions may vary according to the material that is used to form the HBL. As a hole blocking material, any one of suitable hole blocking materials may be used, and examples thereof are an oxadiazole derivative, a triazole derivative, and a phenanthroline derivative. For example, BCP illustrated below may be used as the hole blocking material.

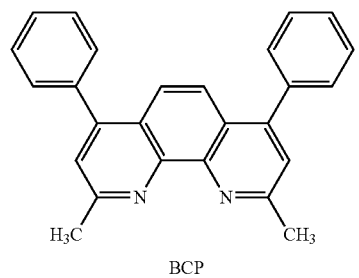

BCP

A thickness of the HBL may be in a range of about 20 Å to about 1000 Å, for example, about 30 Å to about 300 Å. In one embodiment, when the thickness of the HBL is within the ranges described above, excellent hole blocking properties is obtained without a substantial increase in the driving voltage.

In some embodiments, the organic layer of the organic light-emitting device may comprise the compound of Formula 1 by using a deposition method or may be formed using a wet method of coating a solution of the compound of Formula 1.

An organic light-emitting device according to an embodiment of the present invention may be included in various flat panel display apparatuses, for example, a passive matrix organic light-emitting display apparatus and an active matrix organic light-emitting display apparatus. In one embodiment, when the organic light-emitting device is included in an active matrix organic light-emitting display apparatus, the first electrode disposed on a substrate functions as a pixel and may be electrically connected to a source electrode or a drain electrode constituting a thin film transistor. In addition, the organic light-emitting device may be included in a flat panel display apparatus that emits light in opposite directions.

Hereinafter, an organic light-emitting device according to an embodiment of the present invention is described in more detail with reference to the Synthesis Examples and the Examples for the preparation of the compound of Formula 1. However, the organic light-emitting device is not limited thereto.

EXAMPLE

Synthesis Example 1

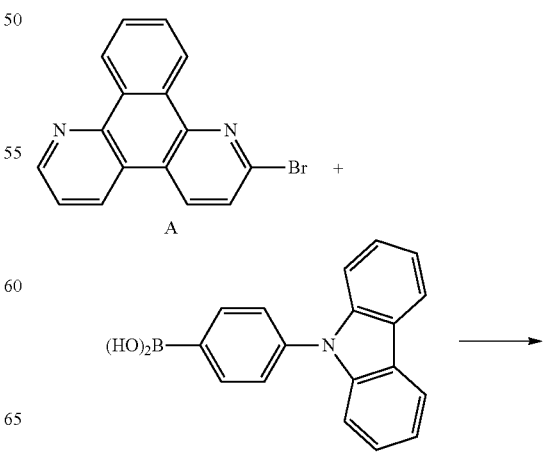

-continued

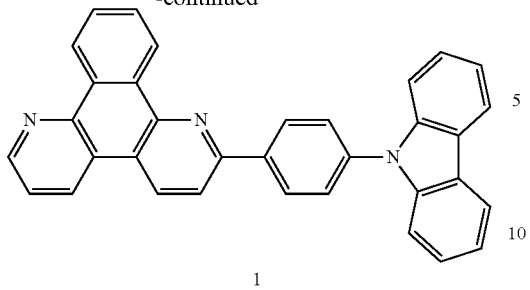
1

Synthesis of Compound 1

10 g (1 eq, 0.044 mol) of Intermediate compound A and 14.06 g (1.1 eq, 0.049 mol) of 4-(9H-carbazol-9-yl)phenylboronic acid were added to a flask, and dissolved with 700 ml of toluene. 0.92 g (0.02 eq, 0.0008 mmol) of Pd(pph$_3$)$_4$ and 30 ml of 2 M K$_2$CO$_3$ solution were added thereto and the mixture was stirred for 12 hours while heating. The reaction solution in which the reaction was completed was filtered through celite, and then subjected to column chromatography to produce 14.7 g (yield=84.2%) of Compound 1.

Elemental Analysis for C34H21N3: calcd C, 86.60; H, 4.49; N, 8.91.

High-resolution Mass Spectrometry (HRMS) for C34H21N3 [M]+: calcd 471. found 471.

Synthesis Example 2

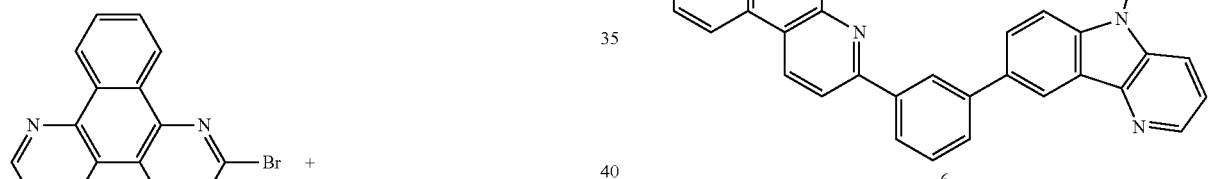
4

Synthesis of Compound 4

14.1 g (yield=83.7%) of Compound 4 was prepared in the same manner as in Synthesis Example 1, except that 3-(9H-carbazol-9-yl)phenylboronic was used instead of 4-(9H-carbazol-9-yl)phenylboronic acid.

Elemental Analysis for C34H21N3: calcd C, 86.60; H, 4.49; N, 8.91.

HRMS for C34H21N3 [M]+: calcd 471. found 471.

Synthesis Example 3

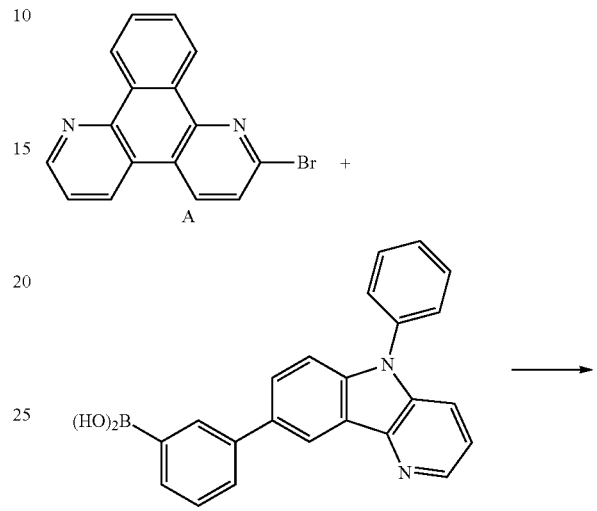
6

Synthesis of Compound 6

16.4 g (yield=86.4%) of Compound 6 was prepared in the same manner as in Synthesis Example 1, except that 3-(5-phenyl-5H-pyrido[3,2-b]indol-8-yl)phenylboronic acid was used instead of 4-(9H-carbazol-9-yl)phenylboronic acid.

Elemental Analysis for C39H24N4: calcd C, 85.38; H, 4.41; N, 10.21.

HRMS for C39H24N4 [M]+: calcd 584. found 584.

Synthesis Example 4

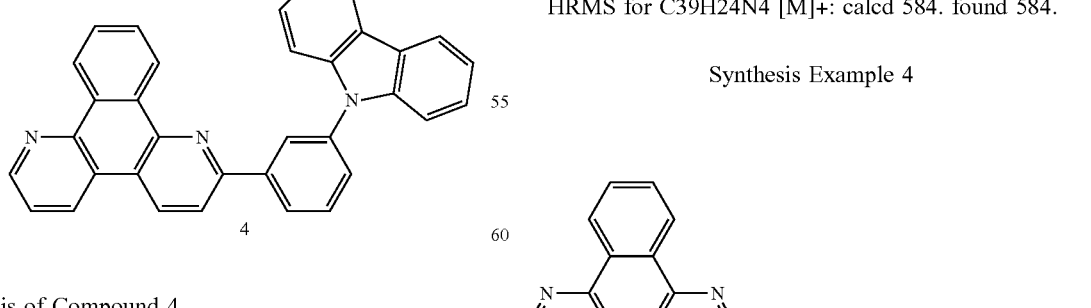

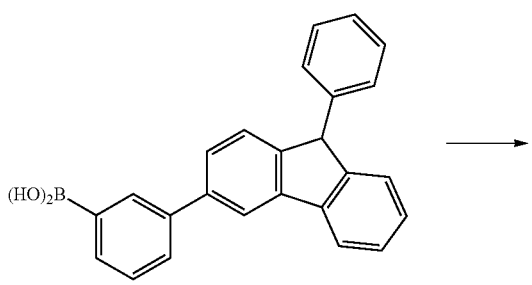

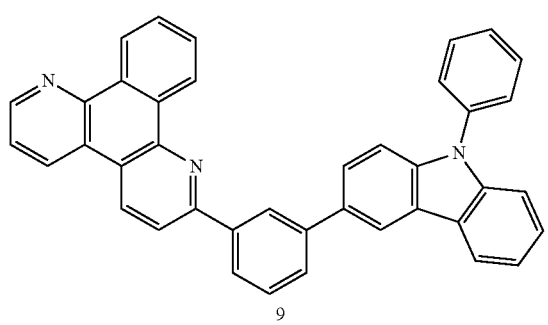

9

Synthesis of Compound 9

15.8 g (yield=85.9%) of Compound 9 was prepared in the same manner as in Synthesis Example 1, except that 3-(9-phenyl-9H-carbazol-3-yl)phenylboronic acid was used instead of 4-(9H-carbazol-9-yl)phenylboronic acid.

Elemental Analysis for C40H25N3: calcd C, 87.73; H, 4.60; N, 7.67.

HRMS for C40H25N3 [M]+: calcd 547. found 547.

Synthesis Example 5

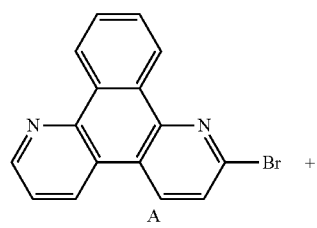

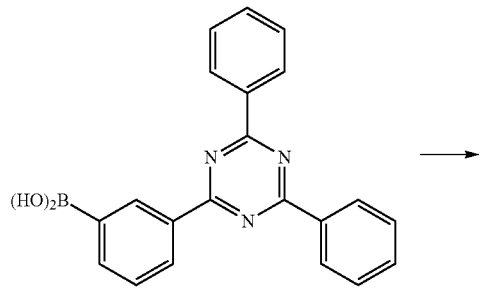

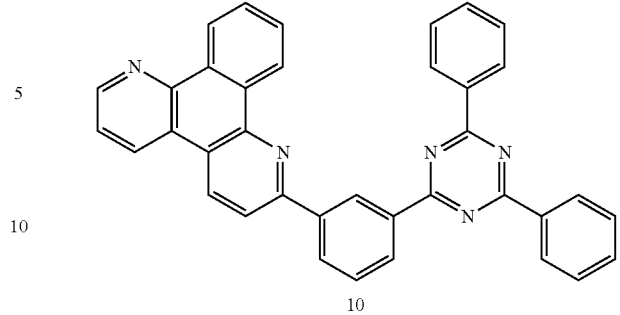

10

Synthesis of Compound 10

17.1 g (yield=83.5%) of Compound 10 was prepared in the same manner as in Synthesis Example 1, except that 3-(4,6-diphenyl-1,3,5-triazin-2-yl)phenylboronic acid was used instead of 4-(9H-carbazol-9-yl)phenylboronic acid.

Elemental Analysis for C37H23N5: calcd C, 82.66; H, 4.31; N, 13.03.

HRMS for C37H23N5 [M]+: calcd 537. found 537.

Synthesis Example 6

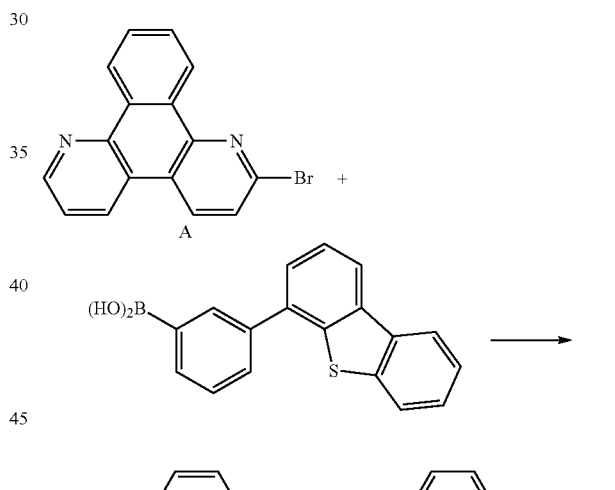

16

Synthesis of Compound 16

11.6 g (yield=86.2%) of Compound 16 was prepared in the same manner as in Synthesis Example 1, except that 3-(dibenzo[b,d]thiophen-4-yl)phenylboronic acid was used instead of 4-(9H-carbazol-9-yl)phenylboronic acid.

Elemental Analysis for C34H20N2S: calcd C, 83.58; H, 4.13; N, 5.73; S, 6.56.

HRMS for C34H20N2S [M]+: calcd 488. found 488.

Synthesis Example 7

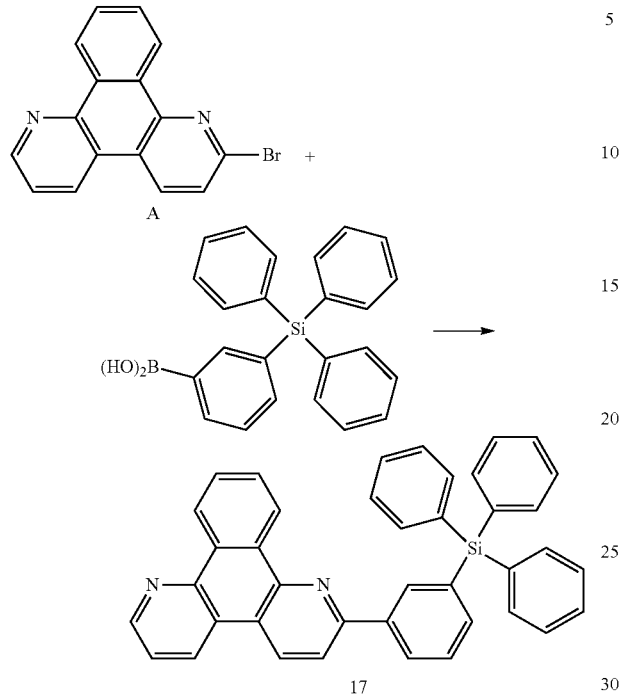

Synthesis of Compound 17

15.1 g (yield=81.7%) of Compound 17 was prepared in the same manner as in Synthesis Example 1, except that 3-(triphenylsilyl)phenylboronic acid was used instead of 4-(9H-carbazol-9-yl)phenylboronic acid.

Elemental Analysis for C40H28N2Si: calcd C, 85.07; H, 5.00; N, 4.96; Si, 4.97.

HRMS for C40H28N2S [M]+: calcd 564. found 564.

Synthesis Example 8

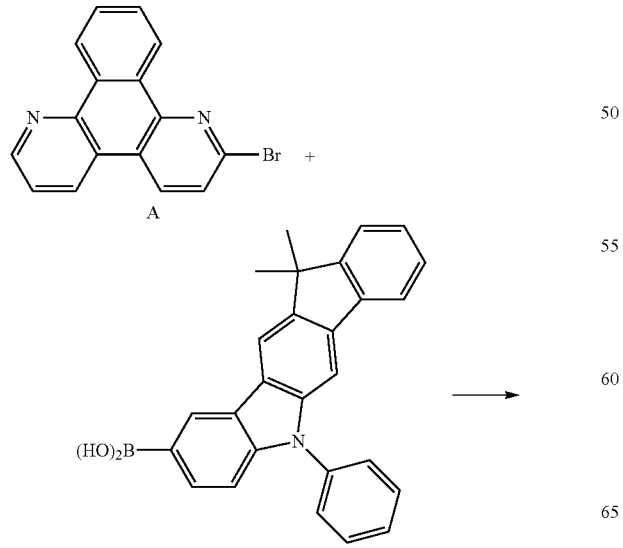

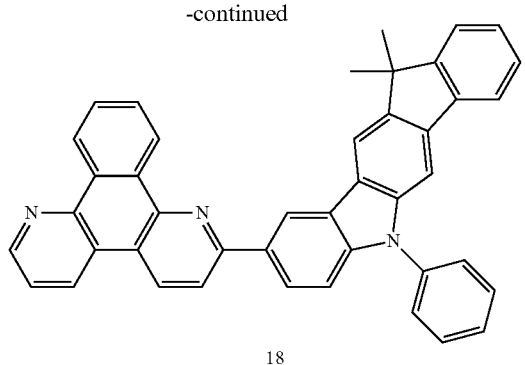

Synthesis of Compound 18

14 g (yield=79.2%) of Compound 18 was prepared in the same manner as in Synthesis Example 1, except that 11,11-dimethyl-5-phenyl-5,11-dihydroindeno[1,2-b]carbazol-2-ylboronic acid was used instead of 4-(9H-carbazol-9-yl)phenylboronic acid.

Elemental Analysis for C43H29N3: calcd C, 87.88; H, 4.97; N, 7.15.

HRMS for C43H29N3 [M]+: calcd 587. found 587.

Synthesis Example 9

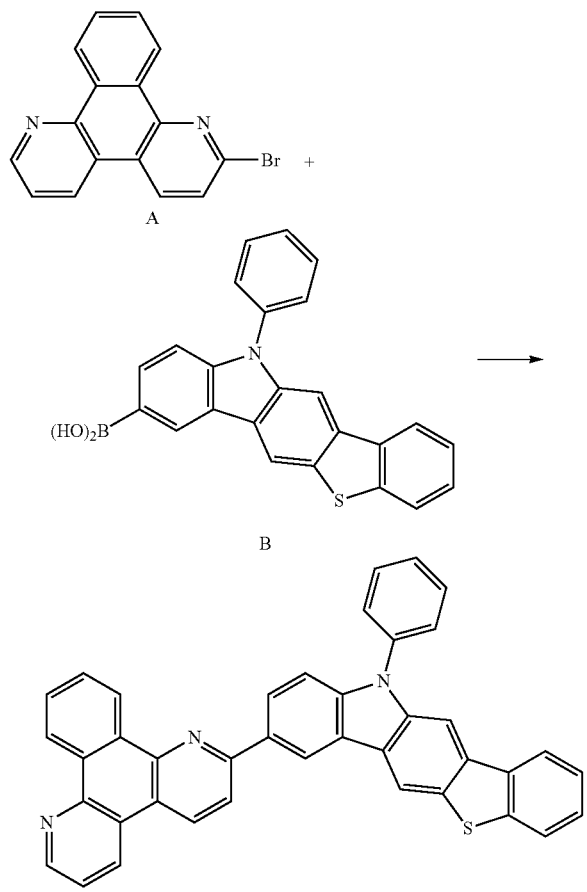

Synthesis of Compound 19

13.7 g (yield=78.3%) of Compound 19 was prepared in the same manner as in Synthesis Example 1, except that Compound B was used instead of 4-(9H-carbazol-9-yl)phenylboronic acid.

Elemental Analysis for C40H23N3S: calcd C, 83.16; H, 4.01; N, 7.27; S, 5.55.

HRMS for C40H23N3S [M]+: calcd 577. found 577.

Synthesis Example 10

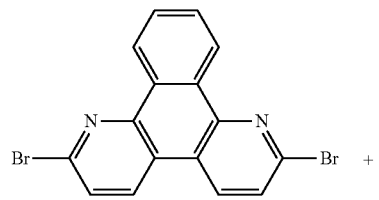

Synthesis of Compound 25

10 g (1 eq, 0.025 mol) of Intermediate Compound C and 12.54 g (2.2 eq, 0.055 mol) of dibenzo[b,d]thiophen-4-ylboronic acid were added to a flask, and dissolved with 500 ml of toluene. 0.57 g (0.02 eq, 0.0005 mmol) of Pd(pph3)4 and 25 ml of 2 M K2CO3 solution were added thereto and the mixture was stirred for 12 hours while heating. A reaction solution in which a reaction was completed was filtered through celite, and then subjected to column chromatography (MC:HEX=1:2) to produce 10.2 g (yield=76.42%) of Compound 25.

Elemental Analysis for C40H22N2S2: calcd C, 80.78; H, 3.73; N, 4.71; S, 10.78.

HRMS for C40H22N2S2 [M]+: calcd 594. found 594.

Synthesis Example 11

Synthesis of Compound E 10 g (1 eq, 0.025 mol) of Compound C and 10.81 g (1.1 eq, 0.0275 mol) of Compound D were added to a flask, and dissolved with 450 ml of toluene. 0.57 g (0.02 eq, 0.0005 mmol) of Pd(pph3)4 and 20 ml of 2 M K2CO3 solution were added thereto and the mixture was stirred for 12 hours while heating. The reaction solution in which the reaction was completed was filtered through celite, and then subjected to column chromatography (MC:HEX=1:2) to produce 15.1 g (yield=64.27%) of Compound 25.

Elemental Analysis for C40H22BrN3S: calcd C, 73.17; H, 3.38; Br, 12.17; N, 6.40; S, 4.88.

HRMS for C40H22BrN3S [M]+: calcd 655. found 655.

Synthesis of Compound 29

10 g (1 eq, 0.015 mol) of Compound E and 4.17 g (1.2 eq, 0.018 mol) of dibenzo[b,d]thiophen-4-ylboronic acid were added to a flask, and dissolved with 350 ml of toluene. 0.34 g (0.02 eq, 0.0003 mmol) of Pd(pph$_3$)$_4$ and 17 ml of 2 M K$_2$CO$_3$ solution were added thereto and the mixture was stirred for 12 hours while heating. The reaction solution in which the reaction was completed was filtered through celite, and then subjected to column chromatography (MC:HEX=1:2) to produce 13.1 g (yield=85.29%) of Compound 29.

Elemental Analysis for C52H29N3S2: calcd C, 82.19; H, 3.85; N, 5.53; S, 8.44.

HRMS for C52H29N3S2 [M]+: calcd 759. found 759.

Example 1

15 Ω/cm$^2$(1200 Å) ITO glass substrate manufactured by Corning Co., Ltd was cut to a size of 50 mm×50 mm×0.7 mm and sonicated with isopropyl alcohol and pure water each for 5 minutes, and then was irradiated under an ultraviolet light thereto for 30 minutes, followed by exposure to ozone. Then, this glass substrate was mounted on a vacuum deposition device, thereby completing the manufacturing of an anode.

2-TNATA was deposited on the anode to form an HIL having a thickness of 750 Å, and then, NPB was deposited on the HIL to form an HTL having a thickness of 750 Å. ADN as a host and BDAVBi as a dopant were co-deposited on the HTL at a weight % ratio of 97:3 to form an EML having a thickness of 200 Å. Alq3 was deposited on the EML to form an ETL having a thickness of 300 Å. Liq was deposited on the ETL to form an EIL having a thickness of 5 Å, and then, Mg:Ag were deposited on the EIL to form a cathode having a thickness of 160 Å. Then, Compound 1 prepared according to Synthesis Example 1 was deposited thereon to form a light-efficiency improvement layer, thereby completing manufacturing of an organic light-emitting device.

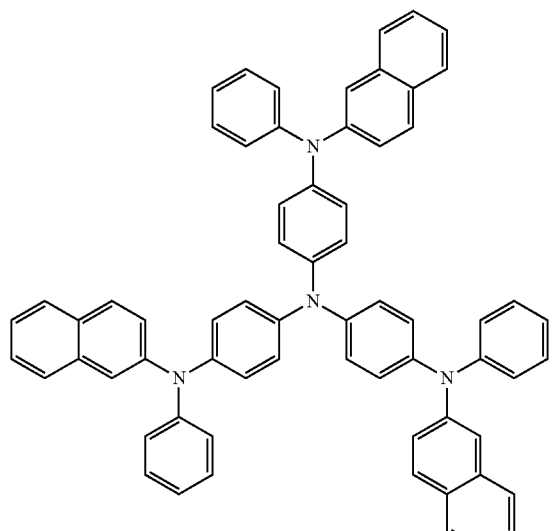

2-TNATA

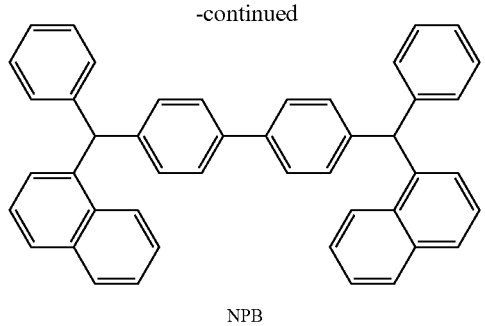

NPB

Example 2

An organic light-emitting device was manufactured in the same manner as in Example 1, except that Compound 4 was used to form a light efficiency-improvement layer.

Comparative Example 1

An organic light-emitting device was manufactured in the same manner as in Example 1, except that Alq3 was used to form a light efficiency-improvement layer having a thickness of 600 Å.

Figure 2:
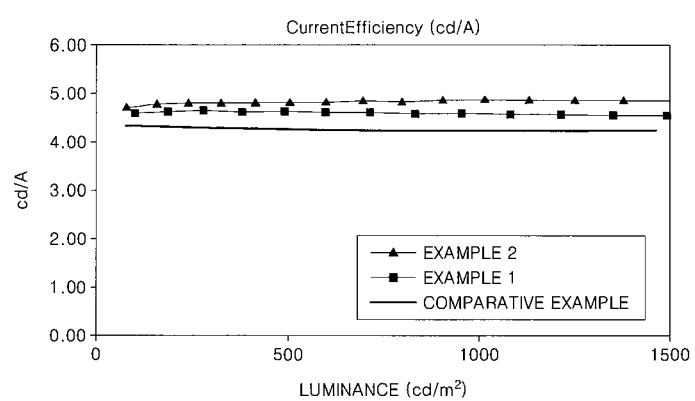
FIG. 2 is a graph showing the efficiency of organic light-emitting devices of Examples 1 and 2 and Comparative Example 1.

FIG. 2 shows a graph of efficiency of organic light-emitting devices of Examples 1 and 2 and Comparative Example 1. Referring to FIG. 2, the organic light-emitting devices of Examples 1 and 2 had higher luminescent efficiency than the organic light-emitting device of Comparative Example 1.

Also, results of Examples 1 and 2 and Comparative Example 1 are shown in Table 1.

TABLE 1

| | Compound | Driving Voltage (V) | Luminescent efficiency (cd/A) |
| --- | --- | --- | --- |
| Example 1 | Compound 1 | 4.3 | 4.6 |
| Example 2 | Compound 4 | 4.3 | 4.8 |
| Comparative Example 1 | Alq3 | 4.3 | 4.3 |

According to embodiments of the present invention, an organic light-emitting device including a light efficiency-improvement layer containing a heterocyclic compound represented by Formula 1 has relatively high external luminescent efficiency.

While the present invention has been particularly shown and described with reference to embodiments thereof, it will be understood by those of ordinary skill in the art that various changes in form and details may be made therein without departing from the spirit and scope of the present invention as defined by the following claims and equivalents thereof.

What is claimed is:
1. An organic light-emitting device comprising:
a first electrode;
a second electrode;
an organic layer between the first electrode and the second electrode; and
a light efficiency-improvement layer disposed on a surface of the first electrode or the second electrode opposite to the organic layer, wherein the light efficiency-improvement layer comprises a heterocyclic compound represented by Formula 1 below:

<Formula 1>

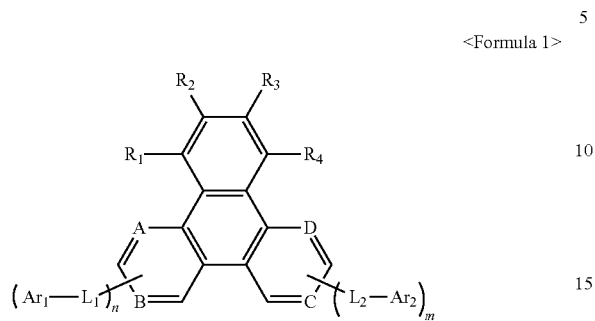

wherein $R_1$ to $R_4$ are, each independently, a hydrogen atom, a deuterium, a substituted or unsubstituted C5 to C60 alkyl group, a substituted or unsubstituted C6 to C60 aryl group, or a substituted or unsubstituted C6 to C60 condensed polycyclic group;

$L_1$ and $L_2$ are, each independently, a single bond, a substituted or unsubstituted C6 to C60 aryl group, a substituted or unsubstituted C3 to C60 heteroaryl group, or a substituted or unsubstituted C6 to C60 condensed polycyclic group;

$Ar_1$ and $Ar_2$ are, each independently, a substituted or unsubstituted C6 to C60 aryl group, a substituted or unsubstituted C3 to C60 heteroaryl group, or a substituted or unsubstituted C6 to C60 condensed polycyclic group;

A, B, C, and D represent, each independently, —CH= or —N=,
provided that A, B, C, and D are not all —CH= at the same time; and m and n are, each independently, an integer of 0 to 3, provided that m and n are not both 0 at the same time.

2. The organic light-emitting device of claim 1, wherein $R_1$ to $R_4$ in Formula 1 are, each independently, a hydrogen atom or a deuterium.

3. The organic light-emitting device of claim 1, wherein $L_1$ and $L_2$ in Formula 1 are, each independently, a single bond, or one of Formulae 2a to 2c,

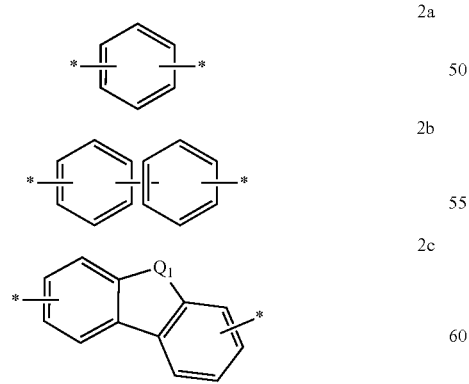

wherein Q1 indicates —$CR_{30}R_{31}$—;
$R_{30}$ and $R_{31}$ are, each independently, a hydrogen atom, a deuterium, a substituted or unsubstituted C1 to C20 alkyl group, a substituted or unsubstituted C6 to C20 aryl group, a substituted or unsubstituted C3 to C20 heteroaryl group, a substituted or unsubstituted C6 to C20 condensed polycyclic group, a halogen group, a cyano group, a nitro group, a hydroxy group, or a carboxy group; and

* represents a bond.

4. The organic light-emitting device of claim 1, wherein $Ar_1$ and $Ar_2$ in Formula 1 are, each independently, one of Formulae 3a to 3j:

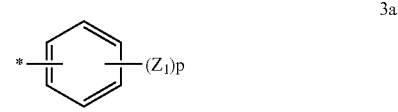

3a

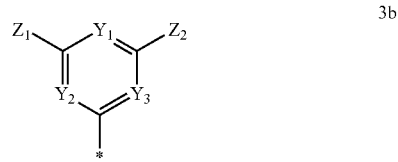

3b

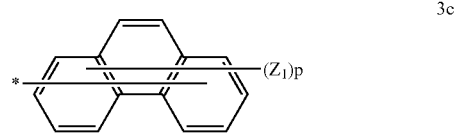

3c

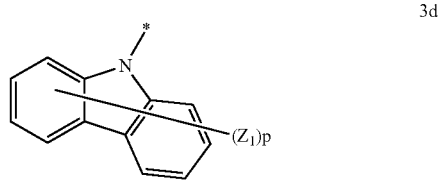

3d

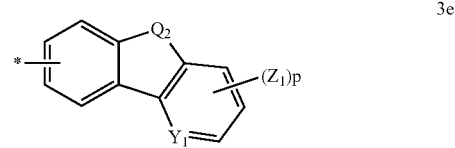

3e

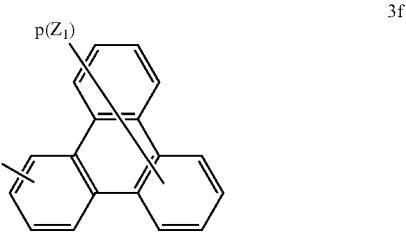

3f

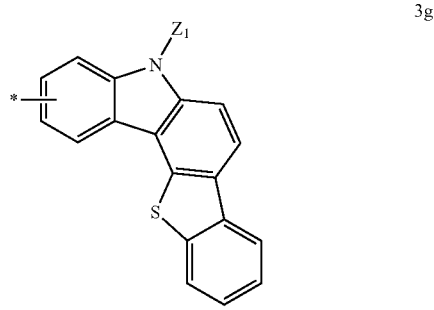

3g

-continued

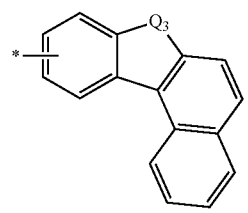  3h

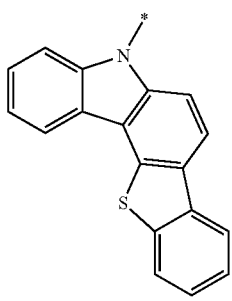  3i

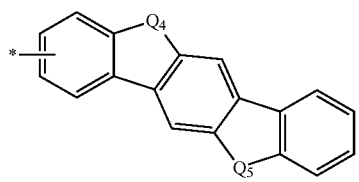  3j wherein, $Q_2$ to $Q_5$ are, each independently, —$CR_{30}R_{31}$—, —$NR_{32}$—, —S—, or —O—;

$Z_1$, $Z_2$, $R_{30}$, $R_{31}$ and $R_{32}$ are, each independently, a hydrogen atom, a deuterium atom, a substituted or unsubstituted C1 to C20 alkyl group, a substituted or unsubstituted C6 to C20 aryl group, a substituted or unsubstituted C3 to C20 heteroaryl group, a substituted or unsubstituted C6 to C20 condensed polycyclic group, an amino group substituted with a C6 to C20 aryl group or a C3 to C20 heteroaryl group, a halogen group, a cyano group, a nitro group, a hydroxy group, —$Si(R_{40})_3$, or a carboxy group;

$R_{40}$ is a substituted or unsubstituted C1 to C20 alkyl group, a substituted or unsubstituted C6 to C20 aryl group, a substituted or unsubstituted C3 to C20 heteroaryl group, or a substituted or unsubstituted C6 to C20 condensed polycyclic group;

$Y_1$, $Y_2$, and $Y_3$ are, each independently, —CH= or —N=, p is an integer of 1 to 9; and

* indicates a bond.

5. The organic light-emitting device of claim 1, wherein in Formula 1, A and D are both —N=, and B and C are both —CH=.

6. The organic light-emitting device of claim 1, wherein the compound of Formula 1 is selected from one of the following compounds:

1

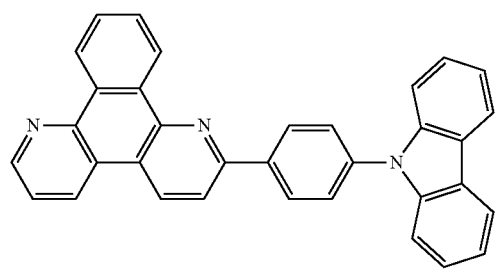

2

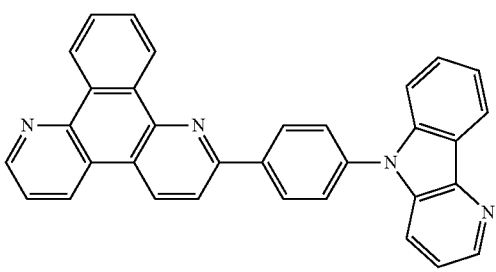

3

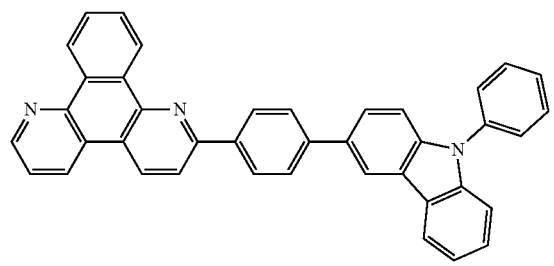

4

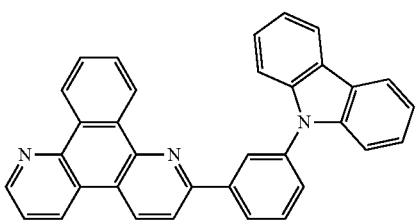

5

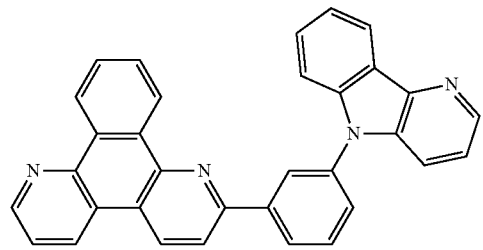

6

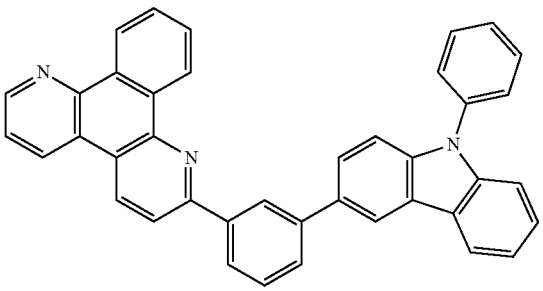

-continued
7
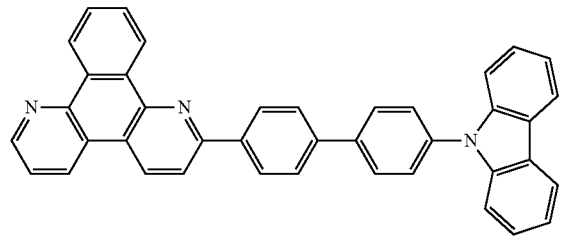
8
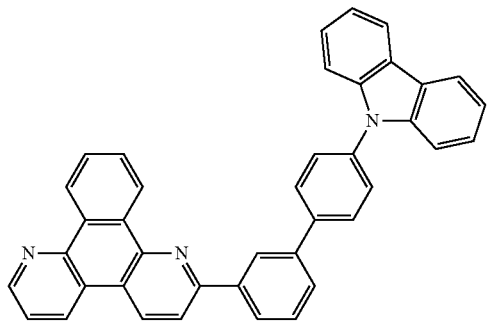
9
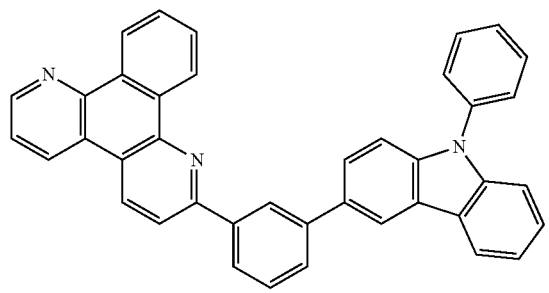
10
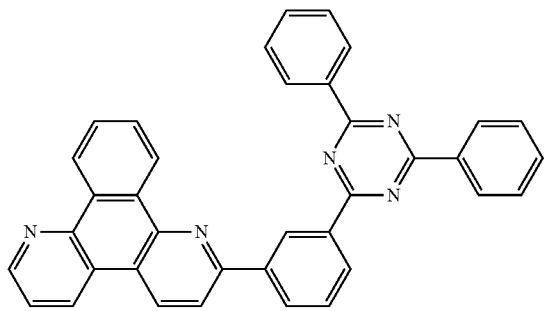
11
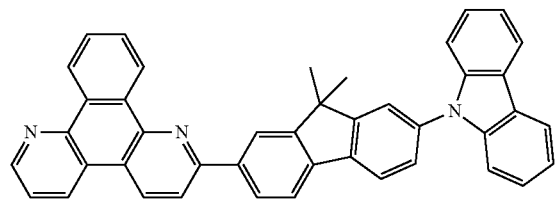
12
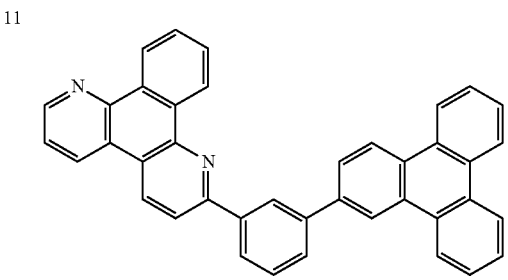
13
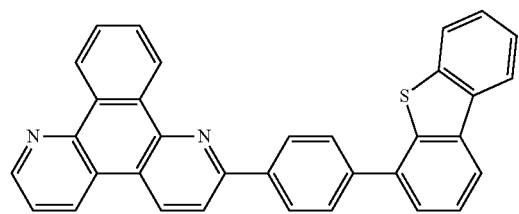
14
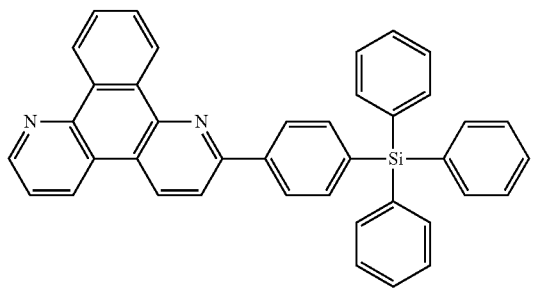
15
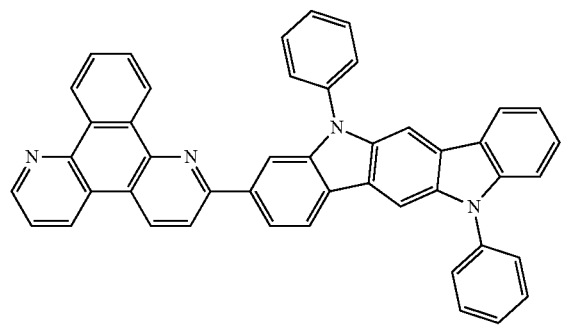
16
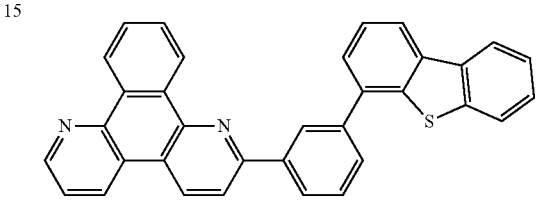

-continued
17
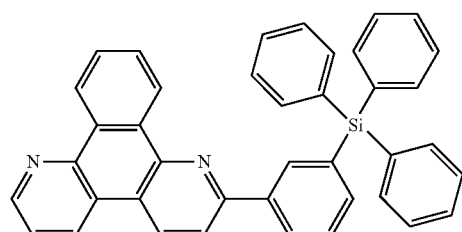
18
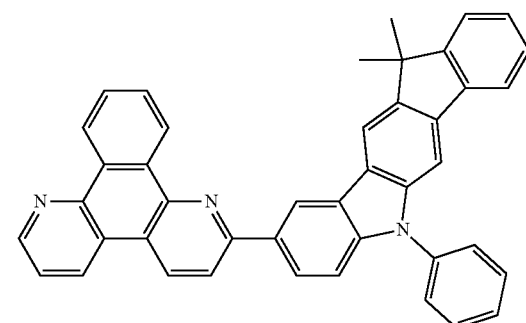
19
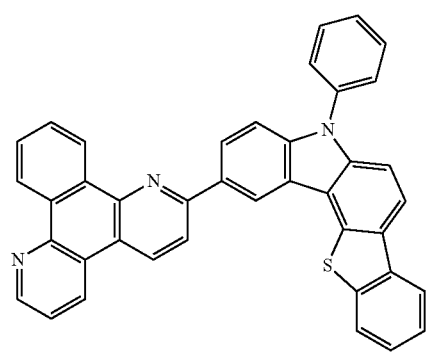
20
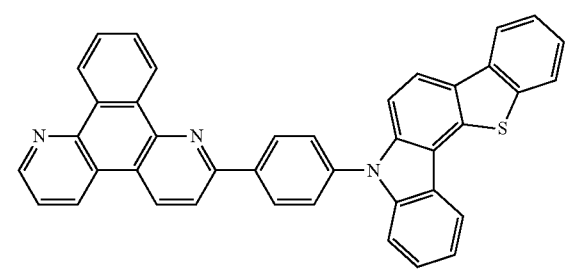
21
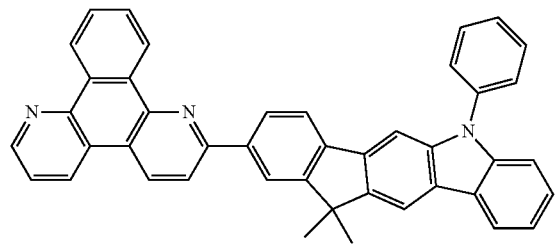
22
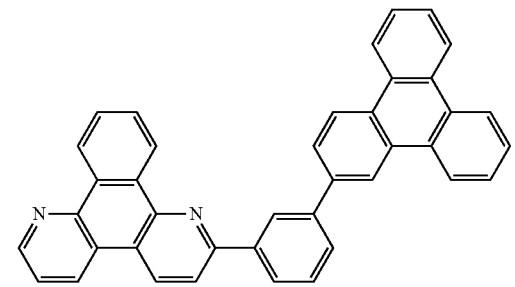
23
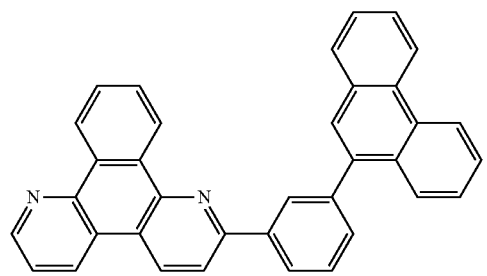
24
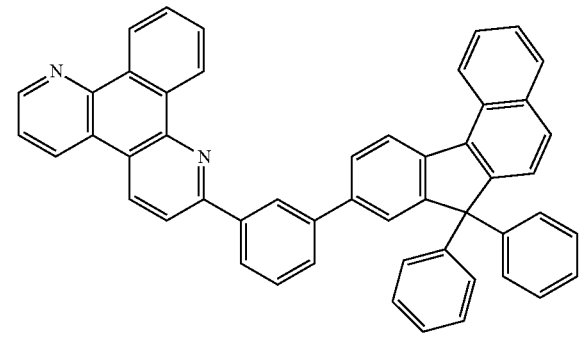
25
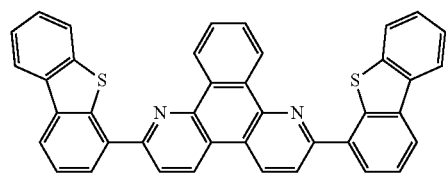
26
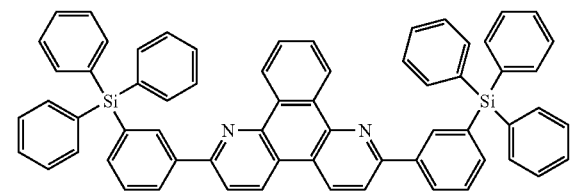

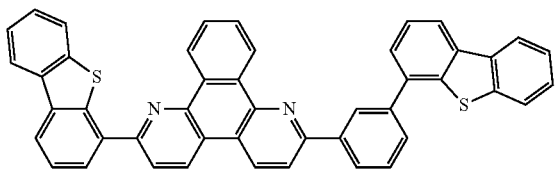

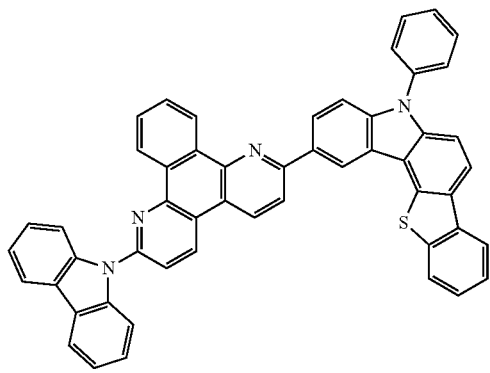

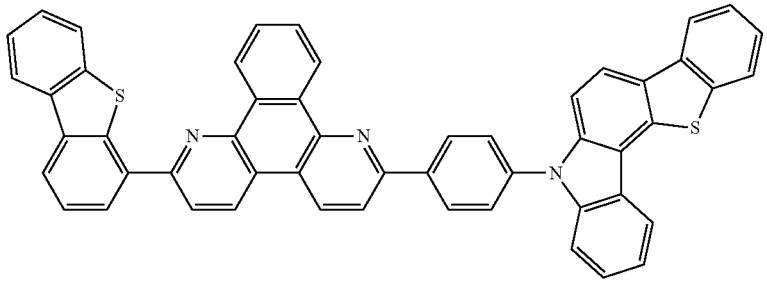

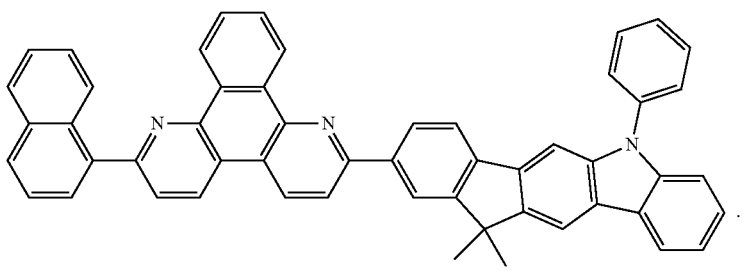

7. The organic light-emitting device of claim 1, wherein the organic light-emitting device comprises an emission layer; and
at least one of an electron injection layer, an electron transport layer, a functional layer having both an electron injection capability and an electron transportation capability, a hole injection layer, a hole transport layer, or a functional layer having both a hole injection capability and a hole transportation capability; and
the emission layer comprises an anthracene-based compound, an arylamine-based compound, or a styryl-based compound.

8. The organic light-emitting device of claim 1, wherein the organic light-emitting device comprises an emission layer;
at least one of an electron injection layer, an electron transport layer, a functional layer having both an electron injection capability and an electron transportation capability, a hole injection layer, a hole transport layer, or a functional layer having both a hole injection capability and a hole transportation capability; and
the emission layer comprises a red layer, a green layer, a blue layer, or a white layer and comprises a phosphorescent compound.

9. The organic light-emitting device of claim 8, wherein the hole injection layer, the hole transport layer, or the functional layer having both a hole injection capability and hole transportation capability comprises a charge-generating material.

10. The organic light-emitting device of claim 9, wherein the charge-generating material comprises a p-dopant.

11. The organic light-emitting device of claim 10, wherein the p-dopant is a quinone derivative.

12. The organic light-emitting device of claim 10, wherein the p-dopant is a metal oxide.

13. The organic light-emitting device of claim 12, wherein the metal oxide is a tungsten oxide or a molybdenum oxide.

14. The organic light-emitting device of claim 10, wherein the p-dopant is a cyano group-containing compound.

15. The organic light-emitting device of claim 14, wherein the cyano group-containing compound is Compound 200 or F4-TCNQ, each illustrated below:

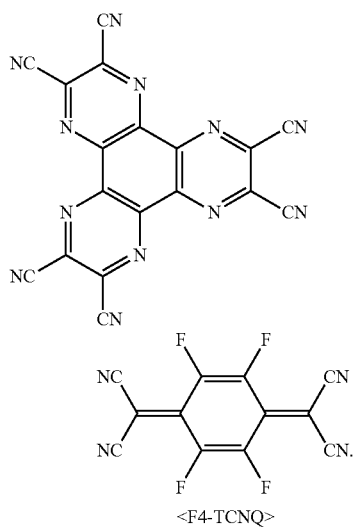

<Compound 200>

<F4-TCNQ>

16. The organic light-emitting device of claim 1, wherein the organic layer comprises an electron transport layer, and the electron transport layer comprises a metal complex.

17. The organic light-emitting device of claim 16, wherein the metal complex is a Li complex.

18. The organic light-emitting device of claim 16, wherein the metal complex is Compound 203 below:

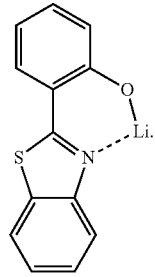

<Compound 203>

19. The organic light-emitting device of claim 1, wherein the organic layer is formed from the compound by a wet process.

20. A flat panel display apparatus comprising a thin film transistor and the organic light-emitting device of claim 1 and the first electrode of the organic light-emitting device being electrically connected to a source electrode or a drain electrode of the thin film transistor.

* * * * *